US010698417B2

(12) United States Patent
Churavy et al.

(10) Patent No.: US 10,698,417 B2
(45) Date of Patent: Jun. 30, 2020

(54) AUTONOMOUS MOWER NAVIGATION SYSTEM AND METHOD

(71) Applicant: MTD Products Inc, Valley City, OH (US)

(72) Inventors: Christopher J. Churavy, Lakewood, OH (US); Edward J. Blanchard, Indianapolis, IN (US)

(73) Assignee: MTD PRODUCTS INC, Valley City, OH (US)

( * ) Notice: Subject to any disclaimer, the term of this patent is extended or adjusted under 35 U.S.C. 154(b) by 120 days.

(21) Appl. No.: 15/588,025

(22) Filed: May 5, 2017

(65) Prior Publication Data

US 2017/0322562 A1 Nov. 9, 2017

Related U.S. Application Data

(60) Provisional application No. 62/332,534, filed on May 6, 2016.

(51) Int. Cl.
| | |
|---|---|
| *G05D 1/02* | (2020.01) |
| *A01D 34/00* | (2006.01) |
| *H03M 13/15* | (2006.01) |
| *G01S 5/00* | (2006.01) |
| *A01D 101/00* | (2006.01) |

(52) U.S. Cl.
CPC .......... *G05D 1/0276* (2013.01); *A01D 34/008* (2013.01); *G05D 1/0265* (2013.01); *H03M 13/156* (2013.01); *A01D 2101/00* (2013.01); *G01S 5/00* (2013.01); *G05D 2201/0208* (2013.01)

(58) Field of Classification Search
CPC ............. G05D 1/0265; G05D 1/0276; G05D 2201/0208; H03M 13/156
See application file for complete search history.

(56) References Cited

U.S. PATENT DOCUMENTS

| | | | |
|---|---|---|---|
| 3,095,939 A | 7/1963 | Hine | |
| 3,550,714 A | 12/1970 | Bellinger | |
| 3,570,227 A | 3/1971 | Bellinger | |
| 3,698,523 A | 10/1972 | Bellinger | |

(Continued)

FOREIGN PATENT DOCUMENTS

| | | |
|---|---|---|
| EP | 0664018 B1 | 7/1997 |
| EP | 1886549 A1 | 2/2008 |

(Continued)

OTHER PUBLICATIONS

International Search Report and Written Opinion dated Aug. 23, 2017 for corresponding application No. PCT/US2017/031286.

*Primary Examiner* — Donald J Wallace
(74) *Attorney, Agent, or Firm* — Wegman Hessler

(57) ABSTRACT

A method for autonomous mower navigation includes receiving a return-to-zero encoded signal including a pseudo-random sequence, transforming the received signal to a non-return-to-zero representation, digitally sampling the non-return-to-zero signal representation in a time domain, filtering the sampled signal utilizing a reference data array based on the return-to-zero encoded signal to produce a filter output, and determining a location of the autonomous mower relative to a defined work area based on an evaluation of the filter output.

26 Claims, 17 Drawing Sheets

(56) References Cited

U.S. PATENT DOCUMENTS

| | | | |
|---|---|---|---|
| 3,924,389 | A | 12/1975 | Kita |
| 4,180,964 | A | 1/1980 | Pansire |
| 4,545,453 | A | 10/1985 | Yoshimura et al. |
| 4,573,547 | A | 3/1986 | Yoshimura et al. |
| 4,777,785 | A | 10/1988 | Rafaels |
| 4,831,813 | A | 5/1989 | Jonas et al. |
| 4,834,308 | A | 5/1989 | Maccaferri |
| 4,887,415 | A | 12/1989 | Martin |
| 4,896,336 | A * | 1/1990 | Henely ............... H04L 7/0332 329/308 |
| 4,919,224 | A | 4/1990 | Shyu et al. |
| 5,119,396 | A * | 6/1992 | Snderford, Jr. ....... H03C 1/545 332/103 |
| 5,220,263 | A | 6/1993 | Onishi |
| 5,323,593 | A | 6/1994 | Cline |
| 5,440,216 | A | 8/1995 | Kim |
| 5,444,965 | A | 8/1995 | Colens |
| 5,841,259 | A | 11/1998 | Kim |
| 6,255,793 | B1 | 7/2001 | Peless et al. |
| 6,321,515 | B1 | 11/2001 | Colens |
| 6,370,453 | B2 | 4/2002 | Sommer |
| 6,764,373 | B1 | 7/2004 | Osawa |
| 6,984,952 | B2 | 1/2006 | Peless et al. |
| 7,024,842 | B2 | 4/2006 | Hunt |
| 7,031,802 | B2 | 4/2006 | Bash |
| 7,117,660 | B1 | 10/2006 | Colens |
| 7,332,890 | B2 | 2/2008 | Cohen |
| 7,346,428 | B1 | 3/2008 | Huffman |
| 7,441,298 | B2 | 10/2008 | Svendsen |
| 7,668,631 | B2 | 2/2010 | Bemini |
| 7,729,801 | B2 | 6/2010 | Abramson |
| 7,729,803 | B2 | 6/2010 | Lim |
| 7,787,989 | B2 | 8/2010 | Colens |
| 8,046,103 | B2 | 10/2011 | Abramson et al. |
| 8,126,642 | B2 | 2/2012 | Trepagnier |
| 8,146,201 | B2 | 4/2012 | Conrad |
| 8,212,521 | B2 | 7/2012 | Choi |
| 8,239,992 | B2 | 8/2012 | Schnittman |
| 8,275,506 | B1 | 9/2012 | Bishel |
| 8,295,979 | B2 | 10/2012 | Thacher et al. |
| 8,352,113 | B2 | 1/2013 | Johnson |
| 8,364,309 | B1 | 1/2013 | Bailey |
| 8,380,350 | B2 | 2/2013 | Ozick |
| 8,390,251 | B2 | 3/2013 | Cohen |
| 8,392,044 | B2 | 3/2013 | Thompson |
| 8,433,468 | B2 | 4/2013 | Johnson |
| 8,452,450 | B2 | 5/2013 | Dooley |
| 8,461,803 | B2 | 6/2013 | Cohen |
| 8,473,131 | B2 | 6/2013 | Leary |
| 8,509,981 | B2 | 8/2013 | Pfeiffer |
| 8,515,578 | B2 | 8/2013 | Chiappetta |
| 8,532,822 | B2 | 9/2013 | Abramson et al. |
| 8,549,826 | B2 | 10/2013 | Kraft |
| 8,594,842 | B2 | 11/2013 | Kraft et al. |
| 8,600,582 | B2 | 12/2013 | Bernini |
| 8,606,401 | B2 | 12/2013 | Ozick |
| 8,618,696 | B2 | 12/2013 | Kurs |
| 8,676,378 | B2 | 3/2014 | Tian |
| 8,706,339 | B2 | 4/2014 | Thompson et al. |
| 8,725,316 | B2 | 5/2014 | Thompson et al. |
| 8,744,663 | B2 | 6/2014 | Sato et al. |
| 8,749,196 | B2 | 6/2014 | Cohen |
| 8,781,627 | B2 | 7/2014 | Sandin et al. |
| 8,788,133 | B2 | 7/2014 | Hung |
| 8,793,020 | B2 | 7/2014 | Chiappetta |
| 8,818,602 | B2 | 8/2014 | Yamamura et al. |
| 8,838,291 | B2 | 9/2014 | Jagenstedt |
| 8,843,245 | B2 | 9/2014 | Choe |
| 8,854,001 | B2 | 10/2014 | Cohen |
| 8,862,288 | B2 | 10/2014 | Vavrina |
| 8,868,237 | B2 | 10/2014 | Sandin |
| 8,884,581 | B2 | 11/2014 | Widmer |
| 8,903,590 | B2 | 12/2014 | Jeon |
| 8,918,213 | B2 | 12/2014 | Rosenstein |
| 8,924,042 | B2 | 12/2014 | Kim |
| 8,930,024 | B2 | 1/2015 | Abramson |
| 8,938,318 | B2 | 1/2015 | Bergstrom et al. |
| 8,942,862 | B2 | 1/2015 | Markusson et al. |
| 8,983,693 | B2 | 3/2015 | Yamamura et al. |
| 9,026,299 | B2 | 5/2015 | Johnson et al. |
| 2004/0201361 | A1 | 10/2004 | Koh |
| 2006/0184293 | A1 | 8/2006 | Konandreas |
| 2011/0046836 | A1 | 2/2011 | Anderson |
| 2011/0169489 | A1 | 7/2011 | Leussler |
| 2011/0202307 | A1 | 8/2011 | Petereit et al. |
| 2011/0234153 | A1 | 9/2011 | Abramson |
| 2011/0241616 | A1 | 10/2011 | Kim |
| 2011/0295423 | A1 | 12/2011 | Anderson |
| 2011/0295424 | A1 | 12/2011 | Johnson et al. |
| 2012/0029752 | A1 | 2/2012 | Johnson |
| 2012/0029754 | A1 * | 2/2012 | Thompson ........... A01D 34/008 701/23 |
| 2012/0029755 | A1 | 2/2012 | Johnson |
| 2012/0161696 | A1 | 6/2012 | Cook |
| 2012/0168240 | A1 | 7/2012 | Wilson |
| 2012/0179321 | A1 | 7/2012 | Biber et al. |
| 2012/0215475 | A1 | 8/2012 | Rutledge |
| 2012/0290165 | A1 | 11/2012 | Ouyang |
| 2013/0000438 | A1 | 1/2013 | Ouellet |
| 2013/0006419 | A1 | 1/2013 | Bergstrom |
| 2013/0025248 | A1 | 1/2013 | Kraft |
| 2013/0030609 | A1 | 1/2013 | Jagenstedt |
| 2013/0041526 | A1 | 2/2013 | Ouyang |
| 2013/0056032 | A1 | 3/2013 | Choe |
| 2013/0060379 | A1 | 3/2013 | Choe |
| 2013/0066484 | A1 | 3/2013 | Markusson |
| 2013/0154553 | A1 | 6/2013 | Steele |
| 2013/0184924 | A1 | 7/2013 | Jagenstedt |
| 2013/0211647 | A1 | 8/2013 | Yamamura et al. |
| 2013/0232717 | A1 | 9/2013 | Lee |
| 2013/0267788 | A1 | 10/2013 | Duan |
| 2013/0274920 | A1 | 10/2013 | Abramson et al. |
| 2013/0317680 | A1 * | 11/2013 | Yamamura ........... G05D 1/0265 701/22 |
| 2013/0326839 | A1 | 12/2013 | Cho |
| 2014/0012418 | A1 | 1/2014 | Johnson |
| 2014/0012453 | A1 | 1/2014 | Johnson |
| 2014/0031979 | A1 | 1/2014 | Borinato |
| 2014/0116469 | A1 | 5/2014 | Kim |
| 2014/0132210 | A1 | 5/2014 | Partovi |
| 2014/0180478 | A1 | 6/2014 | Letsky |
| 2014/0184144 | A1 | 7/2014 | Henricksen |
| 2014/0195050 | A1 | 7/2014 | Lin |
| 2014/0247039 | A1 | 9/2014 | Duan |
| 2014/0306654 | A1 | 10/2014 | Partovi |
| 2014/0324269 | A1 | 10/2014 | Abramson et al. |
| 2014/0340027 | A1 | 11/2014 | Keeling |
| 2014/0360832 | A1 | 12/2014 | Aldrich |
| 2014/0373747 | A1 | 12/2014 | Yagci |
| 2014/0379196 | A1 | 12/2014 | Da Rocha |
| 2015/0006015 | A1 | 1/2015 | Sandin et al. |
| 2016/0014955 | A1 | 1/2016 | Hans |
| 2016/0109241 | A1 | 4/2016 | Eguchi et al. |
| 2016/0366813 | A1 * | 12/2016 | Haneda ................. A01G 25/09 |
| 2017/0139419 | A1 * | 5/2017 | Jagenstedt ............ G05D 1/028 |
| 2017/0153648 | A1 * | 6/2017 | Sjoholm .............. G05D 1/0265 |
| 2018/0081366 | A1 * | 3/2018 | Tan ..................... G05D 1/0265 |

FOREIGN PATENT DOCUMENTS

| | | |
|---|---|---|
| EP | 2073088 B1 | 6/2011 |
| EP | 2369908 A1 | 10/2011 |
| EP | 2447799 A2 | 1/2012 |
| EP | 2412221 A2 | 2/2012 |
| EP | 2412222 A2 | 2/2012 |
| EP | 2412223 A2 | 2/2012 |
| EP | 2447799 A2 * | 5/2012 ........... G05D 1/0265 |
| EP | 2547193 A1 | 1/2013 |
| EP | 2502481 B1 | 2/2013 |
| EP | 2502482 B1 | 5/2013 |
| EP | 2631731 A2 | 8/2013 |
| EP | 2413214 B1 | 9/2013 |
| EP | 2574225 B1 | 9/2013 |
| EP | 2648307 A1 | 10/2013 |

(56) References Cited

FOREIGN PATENT DOCUMENTS

| | | |
|---|---|---|
| EP | 2656718 A1 | 10/2013 |
| EP | 2658073 A1 | 10/2013 |
| EP | 2679083 A1 | 1/2014 |
| EP | 2413215 B1 | 3/2014 |
| EP | 2551739 B1 | 3/2014 |
| EP | 2767150 A1 | 8/2014 |
| EP | 2806325 A2 | 11/2014 |
| EP | 2852029 A1 | 3/2015 |
| EP | 2869688 A1 | 5/2015 |
| EP | 2717110 B1 | 8/2015 |
| WO | 2005081074 A1 | 9/2005 |
| WO | 2008002027 A1 | 1/2008 |
| WO | 2010077198 A1 | 7/2010 |
| WO | 2012052554 A2 | 4/2012 |
| WO | 2014027945 A1 | 2/2014 |
| WO | 2014058358 A1 | 4/2014 |
| WO | 2014081141 A1 | 5/2014 |
| WO | 2014129941 A1 | 8/2014 |
| WO | 2014129943 A1 | 8/2014 |
| WO | 2014129944 A1 | 8/2014 |
| WO | 2014158060 A1 | 10/2014 |
| WO | 2014190208 A2 | 11/2014 |
| WO | 2015022672 A2 | 2/2015 |

\* cited by examiner

AUTONOMOUS MOWER NAVIGATION SYSTEM AND METHOD

CROSS REFERENCE TO RELATED APPLICATIONS

This application claims the benefit of U.S. Provisional Application No. 62/332,534, filed May 6, 2016, the entire disclosure of which is hereby incorporated herein by reference.

FIELD OF THE INVENTION

The disclosed systems and methods are directed to navigation, and more particularly, autonomous mower navigation systems and methods. In an aspect, the disclosed systems and methods are suitable for determining a location of an autonomous mower in relation to a work area, confining or localizing an autonomous mower to a work area, and directing movement of the autonomous mower.

BACKGROUND OF THE INVENTION

Many conventional autonomous mower navigation systems and methods, or systems and methods for confining a robot to a work area, involve complex navigation systems. These complex and expensive systems generally require that the autonomous device be aware of its current location on a given map and can cause the autonomous device to move in a specific predetermined path. Such methods often include Global Positioning System (GPS) technology and can require significant computational capacity and relatively expensive hardware.

Other traditional systems for robot confinement utilize simple periodic signals to determine a robot's position relative to a wire. These methods are prone to interference from other transmitters, for example, other autonomous device wires, dog fences, and the like. Conventional efforts to reduce the effects of interference have included the use of modulated codes and relatively complex signals, however, these signals require additional computing power to process. Thus, there remains a need for an accurate, efficient and cost-effective solution for autonomous mower navigation.

BRIEF SUMMARY OF THE INVENTION

The following presents a simplified summary in order to provide a basic understanding of some aspects of the disclosure. This summary is not an extensive overview of the disclosure. It is not intended to identify key/critical elements or to delineate the scope of the disclosure. Its sole purpose is to present some concepts of the disclosure in a simplified form as a prelude to the more detailed description that is presented later.

In one aspect, a computer implemented method for autonomous mower navigation includes receiving a return-to-zero encoded signal including at least one pseudo-random sequence, transforming the received return-to-zero encoded signal to a non-return-to-zero representation, digitally sampling the non-return-to-zero signal representation in a time domain, filtering the sampled signal utilizing a reference data array based on the return-to-zero encoded signal to produce a filter output, and determining a location of the autonomous device relative to a defined work area based on an evaluation of the filter output.

In another aspect, a system for autonomous mower navigation includes at least one inductive sensor for receiving signal data comprising a return-to-zero encoded signal including at least one pseudo-random sequence transmitted over a wire defining a work area, a processing component in communication with the at least one sensor and for receiving the signal data, the processing component is configured to (i) transform the signal data to a non-return-to-zero representation of the signal data, and (ii) digitally sample the non-return-to-zero signal representation in a time domain, and a filter in communication with the processing component for filtering the sampled signal utilizing a reference data array based on the return-to-zero encoded signal to produce a filter output, the processing component receives the filter output and is configured to determine a location of the autonomous device relative to the defined work area based on an evaluation of the filter output.

In aspects, a computer implemented method for autonomous mower navigation includes transmitting a return-to-zero encoded signal including at least one pseudo-random sequence over a wire defining a work area, receiving and transforming the return-to-zero signal to a non-return-to-zero representation of the transmitted signal, digitally sampling the non-return-to-zero signal representation in a time domain, filtering the sampled signal utilizing a reference data array based on the return-to-zero encoded signal to produce a filter output, and determining a location of the autonomous device relative to the work area based on an evaluation of the filter output.

To accomplish the foregoing and related ends, certain illustrative aspects of the disclosure are described herein in connection with the following description and the drawings. These aspects are indicative, however, of but a few of the various ways in which the principles of the disclosure can be employed and the subject disclosure is intended to include all such aspects and their equivalents. Other advantages and features of the disclosure will become apparent from the following detailed description of the disclosure when considered in conjunction with the drawings.

Figure 1:
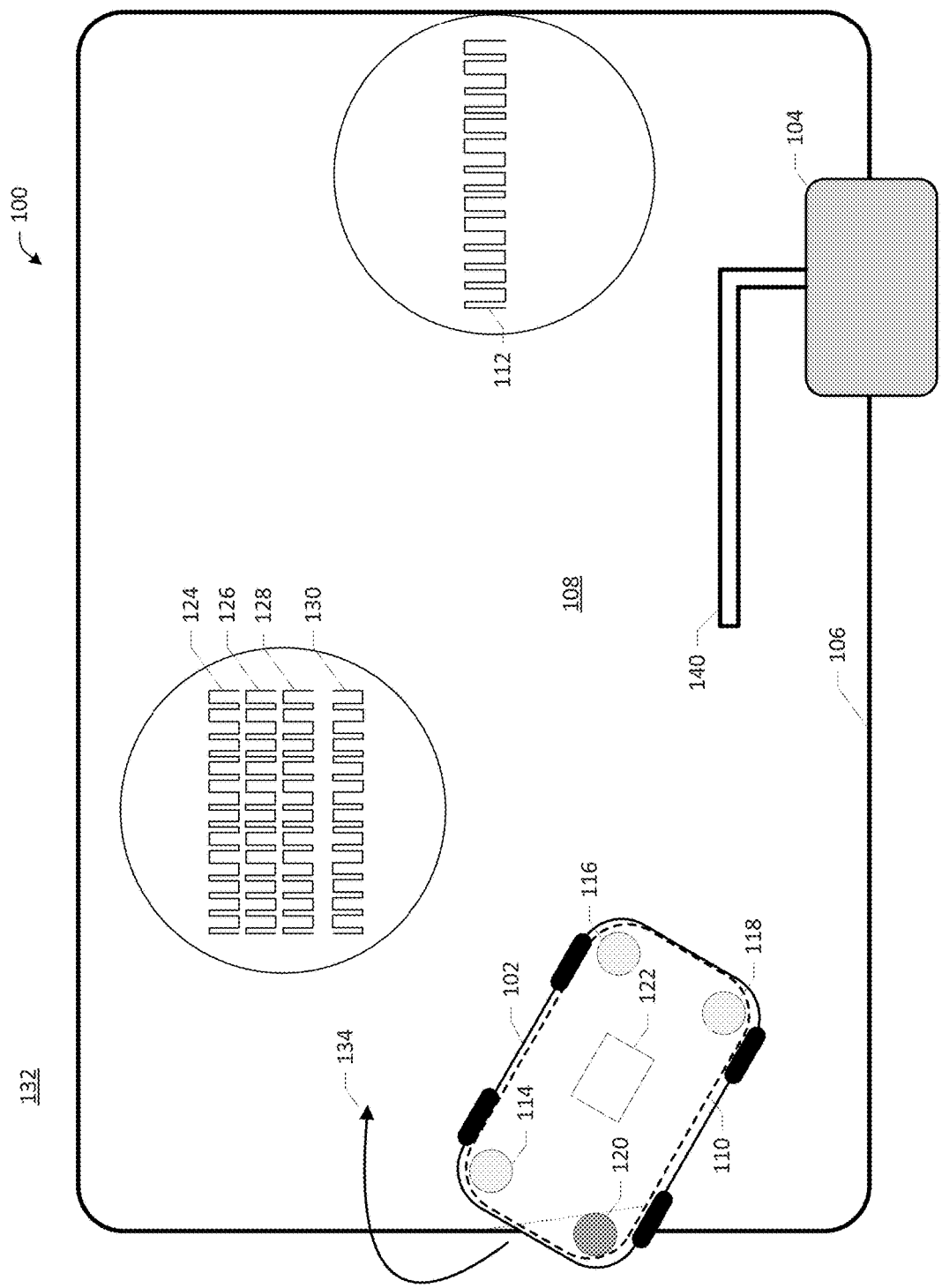
FIG. 1 is an illustration of an example system for autonomous mower navigation in accordance with an aspect of the disclosure.

It should be noted that all the drawings are diagrammatic and not drawn to scale. Relative dimensions and proportions of parts of the figures have been shown exaggerated or reduced in size for the sake of clarity and convenience in the drawings. The same reference numbers are generally used to refer to corresponding or similar features in the different embodiments. Accordingly, the drawings and description are to be regarded as illustrative in nature and not as restrictive.

DETAILED DESCRIPTION

The following terms are used throughout the description, the definitions of which are provided herein to assist in understanding various aspects of the subject disclosure.

As used herein, the term "autonomous mower" refers to an autonomous robot, or most any autonomous device or machine that performs various tasks and functions including lawn mowing, lawn maintenance, vacuum cleaning, floor sweeping and the like.

As used herein, the term "navigation" refers to confinement, or confining an autonomous mower to a work area, determining a location of a robotic mower in relation to a work area, boundary sensing, localization, directing movement of an autonomous mower, ascertaining a position of an autonomous mower, and/or planning and following a route.

As used herein, the term "wire" refers to a wire loop, perimeter wire, perimeter wire loop, conductor, boundary wire, boundary conductor, or other boundary marker for defining a work area. The term "wire" can also refer to multiple wires for defining, for example, multiple work areas, or zones within a work area.

For the purposes of this disclosure, the terms "signal" and "sequence" have been used interchangeably.

In the following description, for purposes of explanation, numerous specific details are set forth in order to provide a thorough understanding of the subject disclosure. It may be evident, however, that the disclosure can be practiced without these specific details. In other instances, well-known structures and devices are shown in block diagram form in order to facilitate describing the disclosure.

As illustrated in FIG. 1, a system for autonomous mower navigation 100 includes an autonomous mower 102, a transmitter 104, a wire 106 defining a work area 108 and a receiver 110. The transmitter 104 can be configured to generate and transmit a periodic signal 112 including a symmetric or asymmetric binary pattern via the wire 106. The receiver 110, associated with autonomous mower 102, includes sensors 114, 116, 118, 120, and a processing component 122 for sampling and analyzing the transmitted signal 112. In an embodiment, receiver 110 analyzes signal data useful for directing movement and operation of the autonomous mower, for example, determining a location of the autonomous mower 102 in relation to the wire 106.

The system and method for autonomous mower navigation can utilize a compressive sampling protocol, e.g. random sampling and/or undersampling methods that translate analog data into an already compressed digital form. The measured data can be "decompressed" to provide highly accurate signals in an efficient manner using a minimum number of sensors and processing hardware. In aspects, the disclosed autonomous mower navigation system and method can include non-uniform signal sampling at an average rate lower than the Nyquist rate. In other embodiments, signal sampling includes the acquisition and processing of signals at rates or time intervals that are at or above the Nyquist frequency.

The transmitter 104 is operatively coupled to a wire 106 defining a work area 108. The transmitter 104 generates and transmits a signal 112 that travels along the wire 106 inducing magnetic fields. The magnetic fields propagate or otherwise travel wirelessly through the air and are received by the autonomous mower 102. The transmitter 104 produces signals for use by the autonomous mower 102 for multiple functions, in particular, to determine the location of the autonomous mower 102 relative to the work area 108 defined by wire 106, and to direct movement of the autonomous mower 102. In an embodiment, the transmitter 104 includes a docking station or charging station electrically connected to the wire 106.

The work area 108 is defined by a boundary, for example, wire 106 arranged around the perimeter of the work area 108. The work area 108 is the area within which the autonomous mower 102 is intended to operate, for example, a grass covered area of a yard, garden, field or park. The wire 106 separates the work area 108, lying within the perimeter defined by the wire 106, from a non-work area 132, which lies outside of the perimeter defined by the wire 106. The autonomous mower 102 is intended to move in relation to the wire 106, and to remain substantially within the work area 108. The autonomous mower 102 can move around the work area 108, for example, in a random pattern or in a predetermined pattern, cutting grass as it goes.

In an embodiment, the wire 106 can be located on a work surface, for example, on the grass. In some embodiments, the wire 106 can be buried under the surface, e.g. in the ground, or the wire 106 can be suspended above the surface of the work area 108.

In an embodiment, the grass can be mowed short in the immediate area where the wire 106 is to be installed. The wire 106 can be secured to the ground utilizing stakes or other fasteners. In time, the grass grows around and over the secured wire, obscuring the wire from sight, and protecting it from damage.

In an embodiment, the wire 106 can include multiple wires for defining, for example, multiple work areas 108, or work zones within the work area 108. The transmitter 104 can also be operatively coupled to a guide wire 140. The transmitter 104 generates and transmits a signal that travels along the guide wire 140 inducing magnetic fields.

The one or more guide wires 140 can be electrically connected to a docking station or charging station. The guide wire 140 can be utilized in directing movement of the autonomous mower 102, for example, to and/or from a location, e.g., a docking station, charging station, or other structure. In an embodiment, the guide wire 140 and the wire 106 defining the work area 108 are electrically connected to a single transmitter 104. In other embodiments, the guide wire 140 and the wire 106 defining the work area 108 are electrically connected to physically and/or electrically separate transmitters 104.

The wires 106, and guide wires 140 can be driven with signals selected from a set of signals having both good auto-correlation and low cross-correlation with the other signals in the set. The properties of good auto-correlation and low cross-correlation aid in noise rejection, and enable the system 100 to distinguish a particular signal 112 transmitted via the perimeter wire 106 from signals transmitted via the guide wire 140, or other nearby wires. Thus, the system 100 can distinguish the perimeter wire signal 112 from the guide wire signal and/or other signals.

The signal 112 is an electromagnetic signal generated by transmitter 104, which travels along the wire 106 inducing a magnetic field that propagates through the air. The signal 112 can be a periodic signal having a symmetric or asymmetric binary pattern and including one or more pseudo-random sequences.

Signal 112 can include return-to-zero encoding. A return-to-zero signal is a signal that drops, or returns to 0, between each pulse. The return-to-zero encoded signal 112 returns to zero even if a number of consecutive 0's or 1's occur in the signal. That is, a neutral or rest condition is included between each bit. The neutral condition can be halfway between the condition representing a 1 bit, and the condition representing a 0 bit.

Signal 112 can include one or more pseudo-random sequences, also referred to as pseudo-random signals or pseudo-random noise. The pseudo-random sequence can include, for example, one or more of Barker Codes, Gold Codes, Kasami Codes, Walsh Hadamard Codes, and/or similarly derived codes.

The pseudo-random sequences may satisfy one or more of the standard tests for statistical randomness. Although pseudo-random signals may appear to lack any definite pattern, pseudo-random signals can include a deterministic sequence that may repeat after a period. The repetition period for the pseudo-random signal can be very long, for example, millions of digits.

The pseudo-random sequences included in the signals 112 can be chosen from a set of possible sequences wherein each sequence of the set possesses 1) good auto-correlation properties and 2) low cross-correlation with other sequences in the set. Pseudo-random sequences having these properties include for example, one or more of Barker Codes, Gold Codes, Kasami Codes, Walsh Hadamard Codes, and/or similarly derived codes. For example, Gold Codes have bounded small cross-correlations within a set, which is useful when multiple devices are broadcasting in the same frequency range. Kasami Codes have low cross-correlation values approaching the Welch lower bound.

The selection and use of sequences having these properties, i.e. good auto-correlation properties and low cross-correlation with other sequences in the set, allows the system 102 to differentiate the signal 112, associated with the wire 106 from signals associated with other perimeter wires, and from signals associated with one or more guide wires 140 of the system 102. The selection and use of the sequences having good auto-correlation and low cross-correlation also enables the system 102 to distinguish signals associated with the wires 106, 140 from other signals including noise, and signals associated with other nearby work areas defined by wires.

Figure 12:
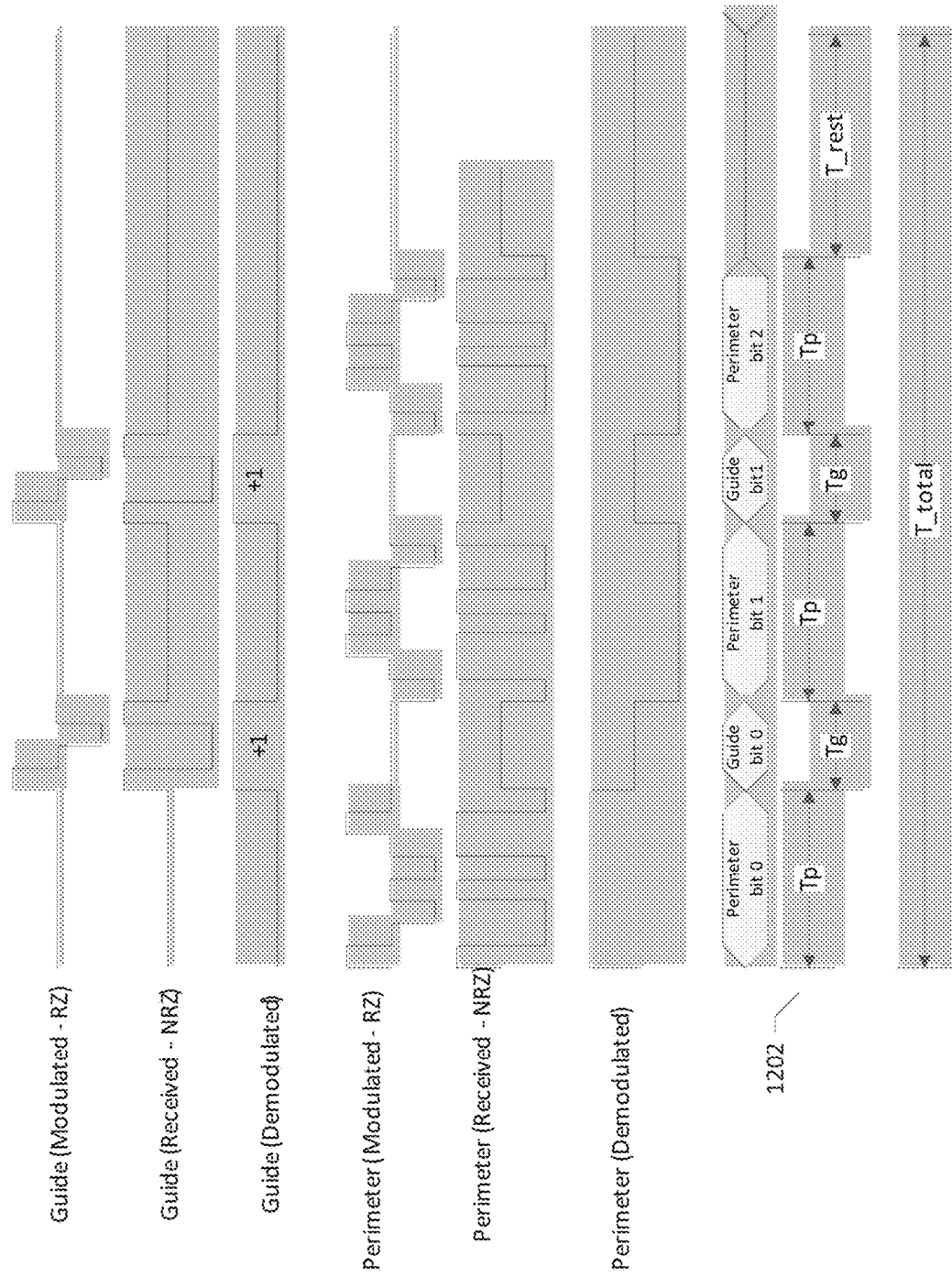
FIG. 12 is an illustration of example signals for autonomous mower navigation in accordance with an aspect of the disclosure.

With reference to FIG. 12, in an embodiment, a full signal transmission period can be divided into several variable length time slots 1202, each slot being assigned to a signal 112 or signals. In an aspect, signal patterns can be sequenced over a transmission period such that one signal, e.g., a signal transmitted via perimeter wire 106, or guide wire 140, is active at a given time.

The receiver 110 can include sensors 114, 116, 118, 120 for detecting, receiving and sampling the transmitted signal 112, and processing component 122, discussed in detail below. In an embodiment, receiver 110, and any of sensors 114, 116, 118, 120 and processing component 122, may be integral to or otherwise housed within a body or shell of the autonomous mower 102. Alternatively, the sensors 114, 116, 118, 120 and processing component 122 can be physically separate from the autonomous mower 102 and/or each other. In further embodiments, the receiver 110 can be a remote component that is in operative communication with, but physically separate from, the autonomous mower 102.

The autonomous mower 102 moves about the work area 108, cutting grass as it goes. In an embodiment, the autonomous mower 102 can operate as a receive-only system that uses the pseudo-random signal transmitted by the transmitter to determine the autonomous mower's 102 location relative to a boundary wire 106. In some embodiments, the autonomous mower 102 can include both receive and transmit capabilities.

Sensors 114, 116, 118, 120 receive the transmitted signal 112 and can be integral to or otherwise housed within the autonomous mower 102, as shown. Sensors 114, 116, 118, 120 can include magnetic sensors, for example, inductive coil sensors, pickup coil sensors and/or search coil sensors for detecting the magnetic field generated by signal 112 transmitted via wire 106.

As shown in FIG. 1, coil sensors 114, 116, 118, 120, for receiving the transmitted signal 112, can be positioned around a periphery of the autonomous mower 102. In other embodiments, sensors 114, 116, 118, 120 can be remote to the autonomous mower 102, for example, located in a work area 108 or outside of a work area 108.

In further embodiments, additional sensors can be utilized to gather data concerning the operation and location of the autonomous mower 102. The additional sensors can be included in the body or structure of the autonomous mower 102, can be remote to the autonomous mower 102, or can be located within the work area 108, or remote to the work area 108. For example, data can be obtained from global positioning system (GPS), Light Detection and Ranging (LIDAR), ultra-wideband radar, beaconing systems, odometer, inertial measurement unit, velocity meter, acceleration sensors, Global System for Mobile Communications (GSM) localization, or most any other systems and sensors, and can be combined with data received via sensors 114, 116, 118, 120. The additional data can be used, for example, to determine the autonomous mower's 102 position in the world with greater accuracy, build maps of a work area 108, and to plan efficient operation of the autonomous mower 102.

The processing component 122 includes hardware, software, and/or firmware components configured to receive, sample, filter, convert, process and use data, for example, data transmitted by the transmitter 104, and data received by the sensors 114, 116, 118, 120, and other sensors and inputs.

In an embodiment, processing component 122 includes a microprocessor, filtering hardware and software, memory, and other associated hardware, software and algorithms for directing operation of the autonomous mower 102. Processing component 122 can perform operations associated with analog to digital signal conversion, signal sampling, signal filtering, execution of fast Fourier transform (FFT) algorithms, and other algorithms, computing correlations, computing cross-correlations, evaluation of correlation data, information determination, location determination, and most any other function related to navigation, e.g., localizing and directing operation, of the autonomous mower 102.

Processing component 122 can receive input data provided by sensors 114, 116, 118, 120, and other sensors and inputs. Processing component 122 can include analog to digital converters, and digital signal processing hardware and/or software for digitally sampling signal data and for processing the sampled data.

In operation, the autonomous mower moves about the work area 108 as the receiver 110 samples the transmitted signal 112 at intervals. Traditional autonomous confinement and signal processing schemes generally require that the receiver be synchronized to the transmitted signal, which is a time consuming operation. The received signal is then used to reconstruct the transmitted signal. The reconstructed transmitted signal is then compared against an expected signal or sequence.

The disclosed autonomous mower navigation system and method have no need to reconstruct a boundary signal, or to synchronize the receiver's time base with that of the transmitter 104, as will be discussed in detail in connection with description of the figures. The disclosed autonomous mower navigation system and method provide a technological improvement, and improved technological results, for example, in terms of accuracy and efficiency, over conventional industry practice. The disclosed autonomous mower navigation system and method provide a solution to a technological problem in robotics navigation that, among other advantages, is less sensitive to noise and utilizes less processing power than traditional robotics navigation.

The disclosed autonomous mower navigation system and methods can be implemented as "computer readable instructions", algorithms and/or modules for execution by the processing component 122. Computer readable instructions can be provided as program modules, such as functions, objects, Application Programming Interfaces (APIs), data structures, and the like, that perform particular tasks or implement particular abstract data types.

In accordance with the laws of electromagnetism, the magnetic field, e.g. the transmitted signal 112, outside the perimeter defined by the perimeter wire 106 exhibits a 180° phase shift relative to the induced magnetic field inside the perimeter defined by the perimeter wire 106.

As shown in FIG. 1, the reconstructed signal 130, received at sensor 120, is 180 degrees out of phase from the expected sequence and the transmitted signal 112. A signal that is 180 degrees out of phase is an indication that the sensor 120, and thus a portion of autonomous mower 102, is located outside of wire 106, or in a non-work area 132.

In an embodiment, the detection of one or more signals that are 180 degrees out of phase with the transmitted signal 112 cause the autonomous mower 102 to be directed to defined work area 108. The autonomous mower 102 can be directed to move in a direction, and/or at an angle, that will bring it back within the defined work area 108, as indicated by arrow 134.

Therefore, when a portion of the received signals are out of phase, and a portion of the received signals are in phase, with transmitted signal 112, the autonomous mower 102 can be made to move in the direction 134 of the sensors 114, 116, 118 associated with the signals 124, 126, 128 that have been determined by processing component 122 to be in phase with the transmitted signal 112.

When the autonomous mower 102 is determined to be outside the work area 108, and has not been brought back within the defined work area 108, or if the transmitted signal 112 is not detected, the autonomous mower 102 can remain stationary in a standby state, ceasing any moving and/or mowing operations.

The disclosed autonomous mower navigation systems and methods can be used to control or inform other robotic behavior including, for example, returning to a charge station, line following, transitioning to other zones within the work area, and improving mowing performance.

Figure 2:
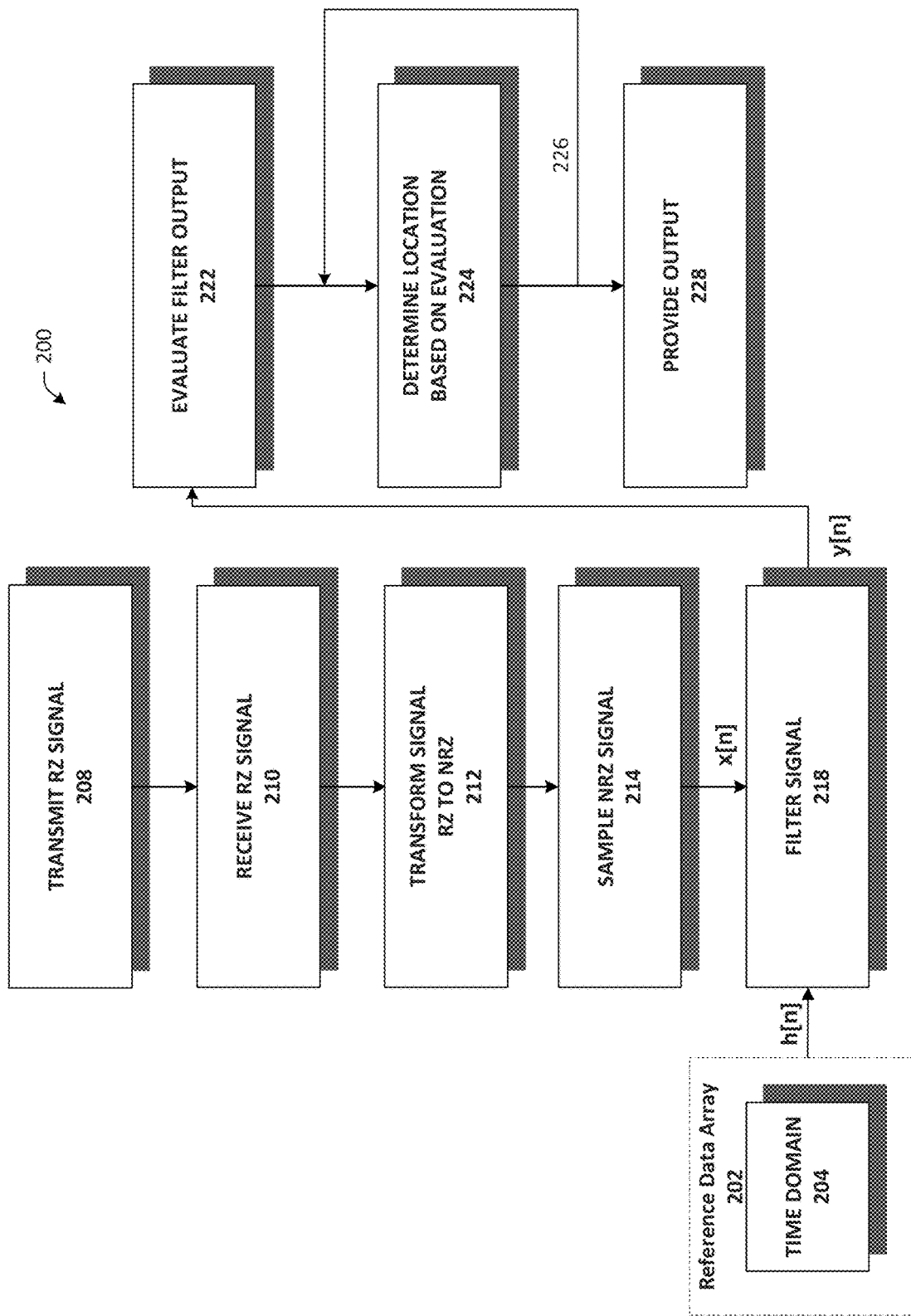
FIG. 2 is an example flow chart of operations for autonomous mower navigation in accordance with an aspect of the disclosure.

FIG. 2 illustrates a method 200 for autonomous mower navigation in accordance with aspects of the disclosure. While, for purposes of simplicity of explanation, the methodologies illustrated in FIGS. 2-7 are shown and described as a series of acts, it is to be understood and appreciated that the subject disclosure is not limited by the order of acts, as some acts may, in accordance with the disclosure, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the disclosure.

FIG. 2 is an example flow chart of operations for autonomous mower navigation which can begin at act 202 where a reference data array is generated and stored in a memory associated with processing component 122. The reference data array can be generated at run time, and/or can be derived in advance and stored by the processing component 122 for later use.

In an embodiment, a reference data array h[n] is the time-reversed time domain representation of the model received signal data, referred to here as the model signal, and can be derived, for example, as $$h[n] = \text{model signal}[-n]$$

In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 204, the reference data array is modified to include data associated with the model received signal and a digital sampling rate, for example, the digital sampling rate implemented at act 214. The reference data array at act 204 includes a discrete time domain representation of the model non-return-to-zero received signal.

At act 208, the transmitter 104 generates a return-to-zero encoded signal including at least one pseudo-random sequence and transmits the signal 112 over the wire 106. The transmitter 104 is operatively coupled to a wire 106 defining a work area 108. The transmitter 104 generates and transmits return-to-zero signal 112 that travels along the wire 106 inducing magnetic fields. The magnetic fields propagate or otherwise travel wirelessly through the air and are received by the receiver 110 associated with autonomous mower 102 at act 210.

At act 210, the receiver 110 receives or otherwise detects the transmitted signal 112. Inductive sensors 114, 116, 118, 120 pick up or otherwise detect the transmitted signal. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal. The sensors 114, 116, 118, 120 produce outputs indicative of the magnetic fields induced at the wire 106 by the transmitted signal 112.

The receiver 110 samples the transmitted signal 112 utilizing a predetermined sampling window. In an embodiment, signal sampling includes acquisition and processing of signals at rates or time intervals that are sub-Nyquist, non-uniform, irregular, random, pseudo-random, uneven, staggered and/or non-equidistant. In an embodiment, the receiver 110 can sample the transmitted signal 112 at a sub-Nyquist rate. In further embodiments, the receiver 110 can sample the transmitted signal 112 at a random or pseudo-random interval.

In embodiments, signal sampling includes the acquisition and processing of signals at rates or time intervals that are at or above the Nyquist frequency. In aspects, the receiver 110 can sample the transmitted signal 112 at a rate beyond twice the highest frequency component of interest in the signal 112. Sampling above the Nyquist frequency can be useful for capturing fast edges, transients, and one-time events. In embodiments, the transmitted signal 112 is sampled at a rate of ten times the Nyquist frequency, or more.

At act 212, the received signal is transformed into a non-return-to-zero representation of the transmitted signal 112. Due in part to the nature of the inductive pickup response of the sensors 114, 116, 118, 120, the transmitted return-to-zero signal can be transformed into a non-return-to-zero phase-shift keyed representation through appropriate filtering techniques.

In aspects, the transformation provides the advantages of simplifying the digital processing and improving the power efficiency of the transmitted signal, thereby allowing for a reduced sampling rate at act 214, and lessening the processing load.

A non-return-to-zero representation refers to a binary code in which the binary 0's and 1's are represented by specific and constant direct-current voltage. The 1's are represented by a positive voltage, and 0's are represented by a negative voltage, with no other neutral or rest condition. As compared to the transmitted return-to-zero signal, which includes a rest state, the non-return-to-zero representation does not include a rest state.

At act 214, the non-return-to zero signal data is digitally sampled, for example, by processing component 122 at a predetermined sampling rate.

At act 218, a filtering step is implemented, for example, a time domain matched filter yields correlation data as the filter output y[n] The correlation data y[n] can be calculated utilizing a time domain based approach by computing the convolution of the digitally sampled signal data x[n], i.e. the output of act 214, and the impulse response h[n], where h[n] is the time-reversed time domain representation of the model received signal data derived at act 204.

$$y[n] = \sum_{k=-\infty}^{\infty} h[n-k]x[k]$$

In an embodiment, a cross-correlation of the reference data array and the transformed received signal is computed, yielding correlation maxima and minima occurring within the acquisition period. Cross-correlation can be used to compare the similarity of two sets of data. Cross-correlation computes a measure of similarity of two input signals as they are shifted by one another. The cross-correlation result reaches a maximum at the time when the two signals match best. If the two signals are identical, this maximum is reached at t=0 (no delay). If the two signals have similar shapes but one is delayed in time and possibly has noise added to it, then correlation can be used to measure that delay.

At act 222, the processing component 122 of the receiver 110 evaluates the correlation data computed at act 220. The evaluations performed at act 222 are utilized at act 224 to determine the location of the autonomous mower 102 relative to the wire 106 (e.g., whether the autonomous mower is inside the defined work area 108 defined by the wire 106, or outside the defined work area 108 defined by the wire 106). The polarity of the received signal can be determined by considering the distribution, frequency, ratios, total count, of the correlation data, for example, the distribution, frequency, ratio, and/or total count of correlation minima and/or maxima occurring within an acquisition period.

Figure 13:
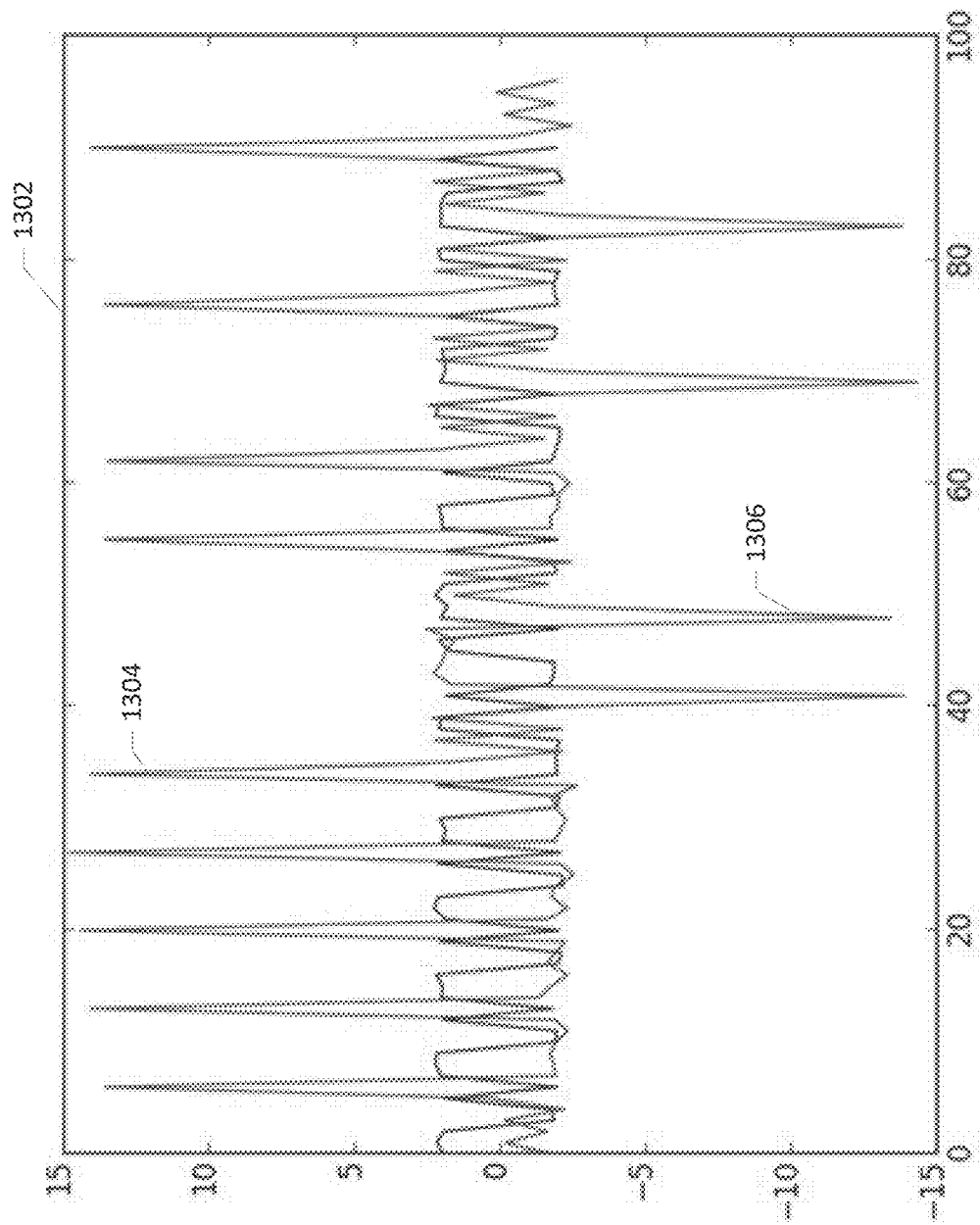
FIG. 13 is an illustration of example signals for autonomous mower navigation in accordance with an aspect of the disclosure.

The polarity of the received signal can be determined utilizing a counting approach. Referring to FIG. 13, in the example correlation data 1302 there are a total of 9 maxima 1304 and 4 minima 1306. A threshold of 9 maxima (or minima) per period may be set to make a determination. For example, when there are 9 maxima 1304, the determination is inside. When there are 9 minima, the determination is outside. If there are neither 9 maxima, nor 9 minima, then no determination may be made.

Still referring to FIG. 13, the polarity of the received signal can be determined utilizing a frequency approach. The frequency of maxima and/or minima occurring within an acquisition period can be established to make a determination of inside or outside. The frequency of maxima 1304 is 9 per 100, and the frequency of minima 1306 is 4 per 100. A determination of inside/outside can be based solely, or in part, on the frequency of maxima and/or minima.

Figure 14:
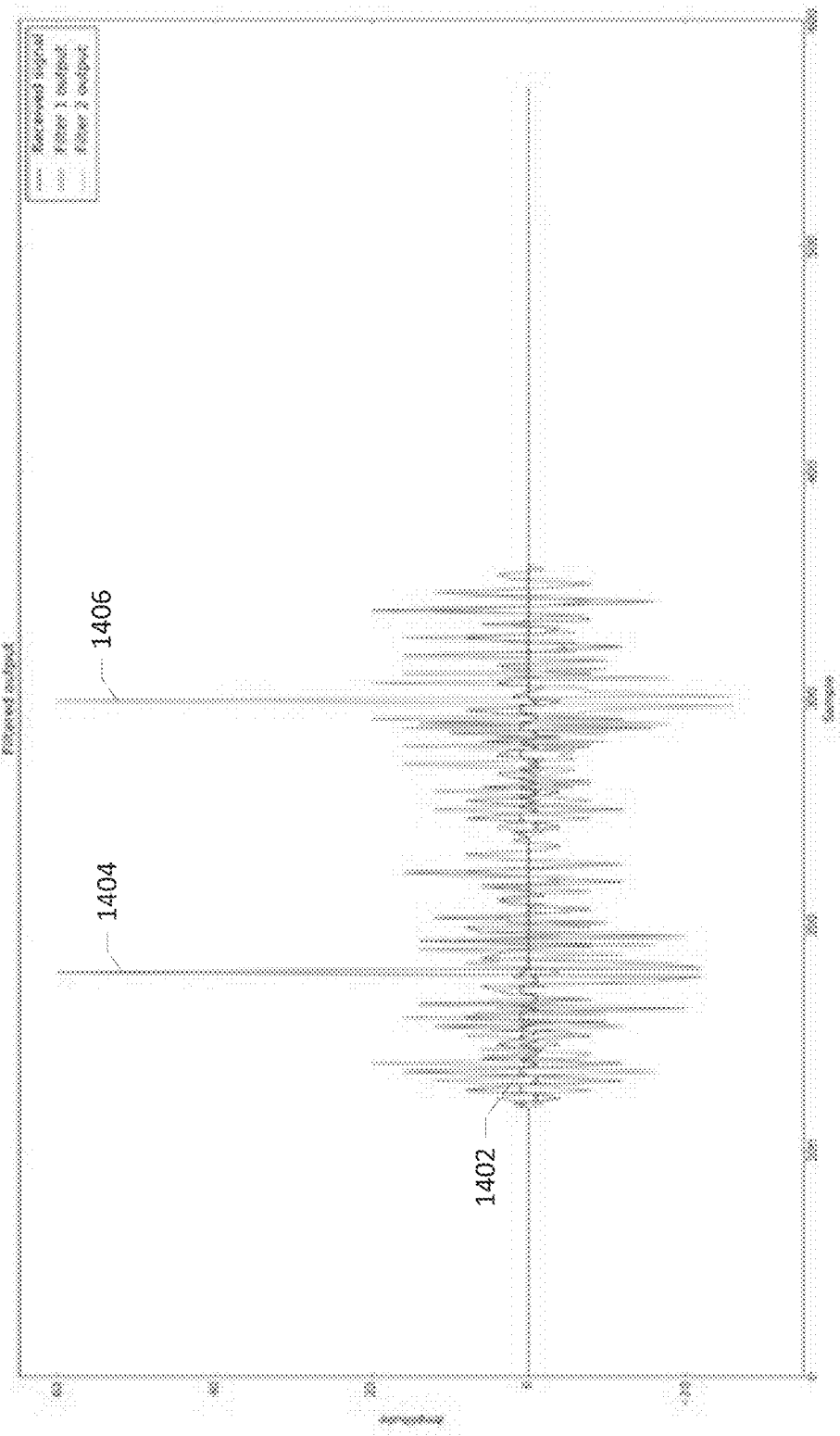
FIG. 14 is an illustration of example signals for autonomous mower navigation in accordance with an aspect of the disclosure.

The maxima and/or minima occurring within an acquisition period for more than one pseudo-random sequence can also be considered. Referring to FIG. 14, the transmitted signal 112 includes two pseudo-random sequences. The received signal is processed to detect maxima and/or minima for each pseudo-random sequence, respectively. In an embodiment, a threshold of one maxima for each pseudo-random sequence can be established in order to make a determination. For example, one maxima for each pseudo-random sequence indicates inside. One minima for each pseudo-random sequence indicates outside. In this example, for other combinations, no determination is made.

The polarity of the received signal can be determined utilizing a ratio approach. In embodiments, the ratio of maxima to minima occurring within an acquisition period can be used to determine inside or outside. For example, a ratio of 9(max):4(min) indicates that a determination of inside should be made, a ratio of 4(max):9(min) indicates a determination of outside.

As described above in connection with act 222, at act 224 the processing component 122 of the receiver 110 determines the location of the autonomous mower 102 relative to the wire 106 based on the evaluations of the correlation data evaluated at act 222. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 226, the previously identified location information, if any, can be used as feedback, and is provided as input to act 224. The previously identified location information, or the output of act 224, is used to improve the accuracy of the location determination step 224 and, in embodiments, functions as a recursive filter.

At act 228, an output based on the location determined at act 224 is provided. The output is used by the system 100 for directing movement and operation of the autonomous mower 102. For example, when a determination is made that the autonomous mower 102 is outside of the wire 106, the autonomous mower can be directed to return to the work area 108. As shown in FIG. 1, when sensors 114, 116, 118 detect signals 124, 126, 128 that are in phase, and sensor 120 detects a signal that is out of phase, the autonomous mower 102 can be made to move in a direction, denoted by arrow 134, such that the autonomous mower returns to the work area 108.

Figure 3:
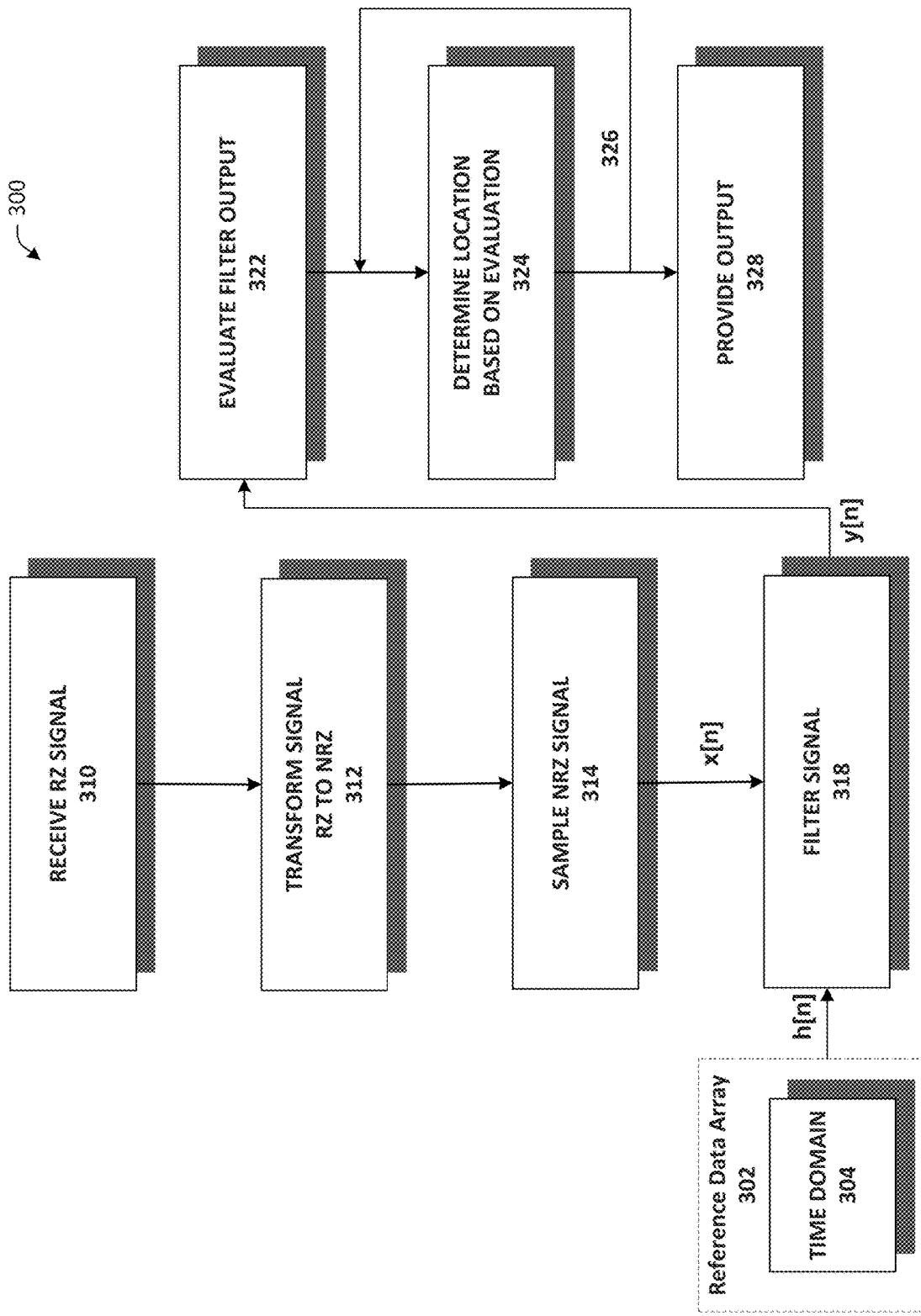
FIG. 3 is an example flow chart of operations for autonomous mower navigation in accordance with an aspect of the disclosure.

FIG. 3 illustrates a method 300 for autonomous mower navigation in accordance with aspects of the disclosure. FIG. 3 is an example flow chart of operations for autonomous mower navigation which can begin at act 302 where a reference data array is generated and stored in a memory associated with processing component 122. The reference data array can be generated at run time, and/or can be derived in advance and stored by the processing component 122 for later use.

In an embodiment, a reference data array h[n] is the time-reversed time domain representation of the model received signal data, referred to here as the model signal, and can be derived, for example, as $h[n]$=model signal$[-n]$ In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 304, the reference data array is modified to include data associated with the model received signal and a digital sampling rate, for example, the digital sampling rate implemented at act 314. The reference data array at act 304 includes a discrete time domain representation of the model non-return-to-zero received signal.

At act 310, the receiver 110 receives or otherwise detects the transmitted signal 112. Inductive sensors 114, 116, 118, 120 pick up or otherwise detect the transmitted signal. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal. The sensors 114, 116, 118, 120 produce outputs indicative of the magnetic fields induced at the wire 106 by the transmitted signal 112.

The receiver 110 samples the transmitted signal 112 utilizing a predetermined sampling window. In an embodiment, signal sampling includes acquisition and processing of signals at rates or time intervals that are sub-Nyquist, non-uniform, irregular, random, pseudo-random, uneven, staggered and/or non-equidistant. In an embodiment, the receiver 110 can sample the transmitted signal 112 at a sub-Nyquist rate. In further embodiments, the receiver 110 can sample the transmitted signal 112 at a random or pseudo-random interval. In embodiments, signal sampling includes the acquisition and processing of signals at rates or time intervals that are at or above the Nyquist frequency.

At act 312, the received signal is transformed into a non-return-to-zero representation of the transmitted signal 112. Due in part to the nature of the inductive pickup response of the sensors 114, 116, 118, 120, the transmitted return-to-zero signal can be transformed into a non-return-to-zero phase-shift keyed representation through appropriate filtering techniques.

At act 314, the non-return-to zero signal data is digitally sampled, for example, by processing component 122 at a predetermined sampling rate.

At act 318, a filtering step is implemented, for example, a time domain matched filter yields correlation data as the filter output y[n] The correlation data y[n] can be calculated utilizing a time domain based approach by computing the convolution of the digitally sampled signal data x[n], i.e. the output of act 214, and the impulse response h[n], where h[n] is the time-reversed time domain representation of the model received signal data derived at act 304.

$$y[n] = \sum_{k=-\infty}^{\infty} h[n-k]x[k]$$

In an embodiment, a cross-correlation of the reference data array and the transformed received signal is computed, yielding correlation maxima and minima occurring within the acquisition period. Cross-correlation can be used to compare the similarity of two sets of data. Cross-correlation computes a measure of similarity of two input signals as they are shifted by one another. The cross-correlation result reaches a maximum at the time when the two signals match best. If the two signals are identical, this maximum is reached at t=0 (no delay). If the two signals have similar shapes but one is delayed in time and possibly has noise added to it, then correlation can be used to measure that delay.

At act 322, the processing component 122 of the receiver 110 evaluates the correlation data computed at act 320. The evaluations performed at act 322 are utilized at act 324 to determine the location of the autonomous mower 102 relative to the wire 106 (e.g., whether the autonomous mower is inside the defined work area 108 defined by the wire 106, or outside the defined work area 108 defined by the wire 106). The polarity of the received signal can be determined by considering the distribution, frequency, ratios, total count, of the correlation data, for example, the distribution, frequency, ratio, and/or total count of correlation minima and/or maxima occurring within an acquisition period.

At act 322, the processing component 122 of the receiver 110 evaluates the correlations computed at act 320. The evaluations performed at act 322 are utilized at act 324 to determine the location of the autonomous mower 102 relative to the wire 106. The polarity of the received signal can be determined by considering the distribution, frequency, ratios, total count, of the correlation data as described in detail in connection with FIG. 2 above.

At act 324 the processing component 122 of the receiver 110 determines the location of the autonomous mower 102 relative to the wire 106 based on the evaluations of the correlation data evaluated at act 322. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 326, the previously identified location information, if any, can be used as feedback, and is provided as input to act 324. The previously identified location information, or the output of act 324, is used to improve the accuracy of the location determination step 324 and, in embodiments, functions as a recursive filter.

At act 328, an output based on the location determined at act 324 is provided. The output is used by the system 100 for directing movement and operation of the autonomous mower 102. For example, when a determination is made that the autonomous mower 102 is outside of the wire 106, the autonomous mower can be directed to return to the work area 108. As shown in FIG. 1, when sensors 114, 116, 118 detect signals 124, 126, 128 that are in phase, and sensor 120 detects a signal that is out of phase, the autonomous mower 102 can be made to move in a direction, denoted by arrow 134, such that the autonomous mower returns to the work area 108.

Figure 4:
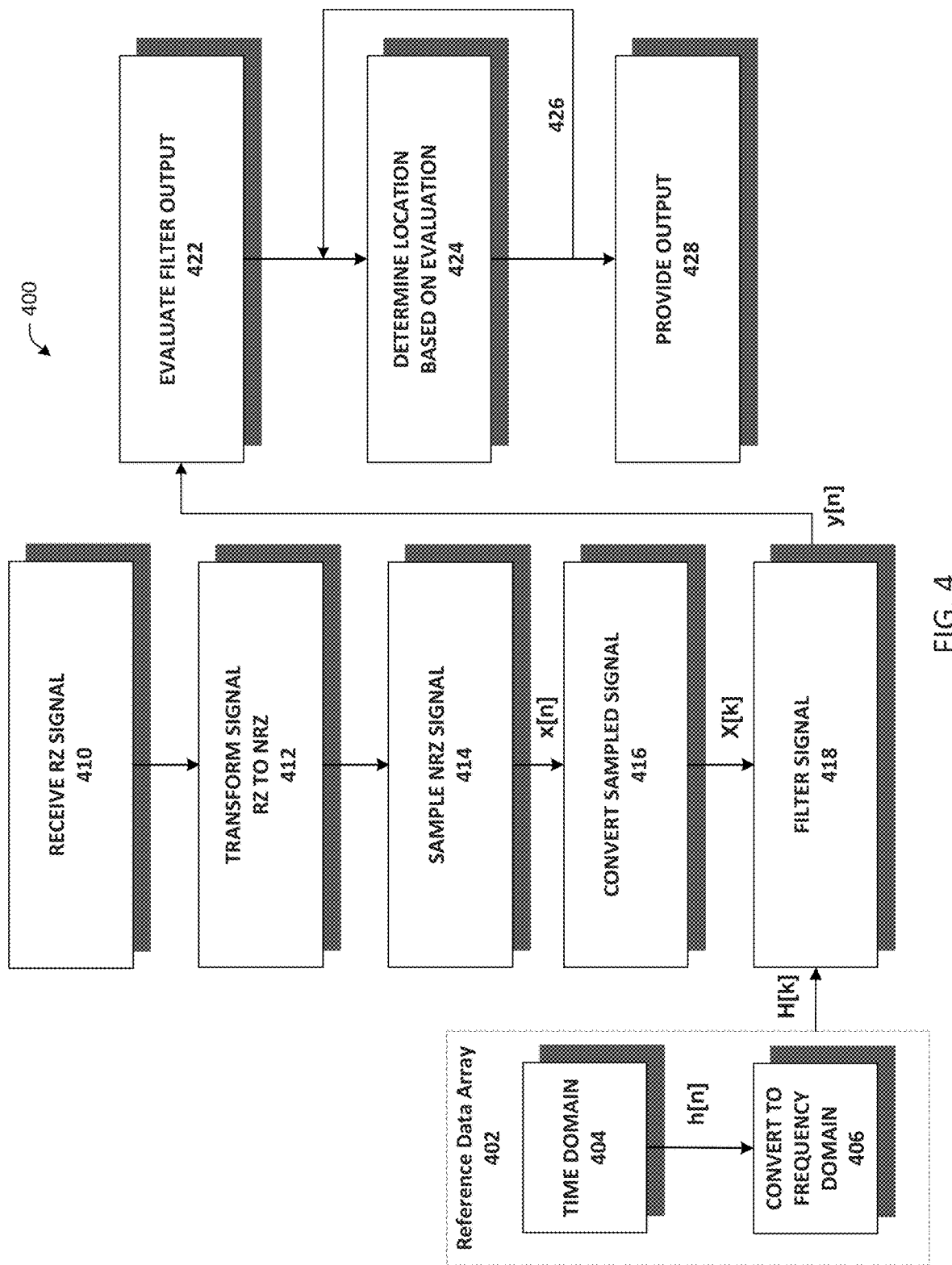
FIG. 4 is an example flow chart of operations for autonomous mower navigation in accordance with an aspect of the disclosure.

FIG. 4 illustrates a method 400 for autonomous mower navigation in accordance with aspects of the disclosure. FIG. 4 is an example flow chart of operations for autonomous mower navigation which can begin at act 402 where a reference data array is generated and stored in a memory associated with processing component 122. The reference data array can be generated at run time, and/or can be derived in advance and stored by the processing component 122 for later use.

In an embodiment, a reference data array h[n] is the time-reversed time domain representation of the model received signal data, referred to here as the model signal, and can be derived, for example, as $$h[n] = \text{model signal}[-n]$$

In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 404, the reference data array is modified to include data associated with the model received signal and a digital sampling rate, for example, the digital sampling rate implemented at act 414. The reference data array at act 404 includes a discrete time domain representation of the model non-return-to-zero received signal.

At act 406, the reference data array is converted to a discrete frequency domain transformation of the discrete time domain representation of the model received signal generated at act 404. In an embodiment, a fast Fourier transform (FFT) algorithm computes the discrete Fourier transform (DFT).

The frequency domain reference data array H[k], or frequency response, can be calculated by time-reversing and zero-padding the time domain model received signal data, referred to in the below equation as model signal, computing the FFT, and computing the complex conjugate of the result, where the number$_{samples}$ is determined based on the digital filtering rate implemented, for example, at the signal sampling act 414.

$$\text{model signal}'[n] = \begin{cases} \text{model signal}[-n]; n = 0:length_{model\ signal} \\ 0; length_{model\ signal} + 1:number_{samples} \end{cases}$$

$$H[k] = FFT\{\text{model signal}'[n]\}$$

At act 410, the receiver 110 receives a transmitted signal 112, for example, a return-to-zero encoded periodic signal including an asymmetric or symmetric binary pattern including at least one pseudo-random sequence. Inductive sensors 114, 116, 118, 120 pick up the transmitted signal 112. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal.

At act 412, the received signal is transformed into a non-return-to-zero representation of the transmitted return-to-zero encoded signal 112. Due in part to the nature of the inductive pickup response of the sensors 114, 116, 118, 120, the transmitted return-to-zero signal 112 can be transformed into a non-return-to-zero phase-shift keyed representation through appropriate filtering techniques.

At act 414, the non-return-to-zero signal data is digitally sampled, for example, by processing component 122 at a pre-determined sampling rate. At act 416, the digitally sampled non-return-to-zero signal data is converted, or transformed, to a frequency domain representation, utilizing for example, a fast Fourier transform (FFT) algorithm producing X[k].

At act 418, a filtering step is implemented, for example, a frequency domain matched filter yields correlation data as the filter output y[n]. The correlation data y[n] can be calculated utilizing a frequency domain based approach by computing a cross-correlation of the frequency domain signal data output of act 416 x[n] and the output of the reference data array H[k] yielding correlation data including maxima and minima occurring within an acquisition period.

The frequency domain approach of act 418 computes the FFT of the output of act 416 x[n]. The resultant data array X[k] is multiplied by the output of the reference data array H[k], yielding M. When X[k] and H[k] have different lengths, two equal length sequences can be created by adding zero value samples at the end of the shorter of the two sequences. This is commonly referred to as zero-filling or zero padding. The FFT lengths in the algorithm, that is the lengths of X[k] and H[k], should be equal.

$$X[k]=FFT\{x[n]\}$$

$$Y[k]=X[k]H[k]$$

The result Y[k] can be transformed back into the time domain, yielding y[n], an output of the filter step 418:

$$y[n]=IFFT\{Y[k]\}$$

In an embodiment, the filter step 418 comprises computing a cross-correlation by multiplying the frequency domain representation of the transformed and sampled received signal by the reference data array to obtain a product, and performing an inverse fast Fourier transform on the product to produce a filter output including at least one correlation maxima and/or at least one correlation minima.

At act 422, the processing component 122 of the receiver 110 evaluates the output y[n] of the filter step 418. The evaluations performed at act 422 are utilized at act 424 to determine the location of the autonomous mower 102 relative to the wire 106.

The evaluations performed at act 422 can include an evaluation of correlation data computed at act 418. For example, the polarity of the received signal, and thus the location of the autonomous mower 102 relative to the area defined by the wire 106, can be determined by considering the distribution, frequency, ratios, total count, of correlation data computed at act 418. In an embodiment, the polarity of the received signal can be determined utilizing a counting approach. The maxima and/or minima occurring within an acquisition period for signals including more than one pseudo-random sequence can also be considered.

As described above in connection with act 422, at act 424 the processing component 122 of the receiver 110 determines the location of the autonomous mower 102 relative to the wire 106 based on the evaluations completed at act 422 of the filtering activities conducted at act 418. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 426, previously identified location information, if any, can be used as feedback, and is provided as input to act 424. The previously identified location information, the output of act 424, is used to improve the accuracy of the location determination step 424 and, in embodiments, functions as a recursive filter.

At act 428, an output based on the location determined at act 424 is provided. The output is used by the system 100 for directing movement and operation of the autonomous mower 102.

At act 422, the processing component 122 of the receiver 110 evaluates the correlations computed at act 420. The evaluations performed at act 422 are utilized at act 424 to determine the location of the autonomous mower 102 relative to the wire 106. The polarity of the received signal can be determined by considering the distribution, frequency, ratios, total count, of the correlation data as described in detail in connection with FIG. 2 above.

The output is used by the system 100 for directing movement and operation of the autonomous mower 102. For example, when a determination is made that the autonomous mower 102 is outside of the wire 106, the autonomous mower can be directed to return to the work area 108.

Figure 5:
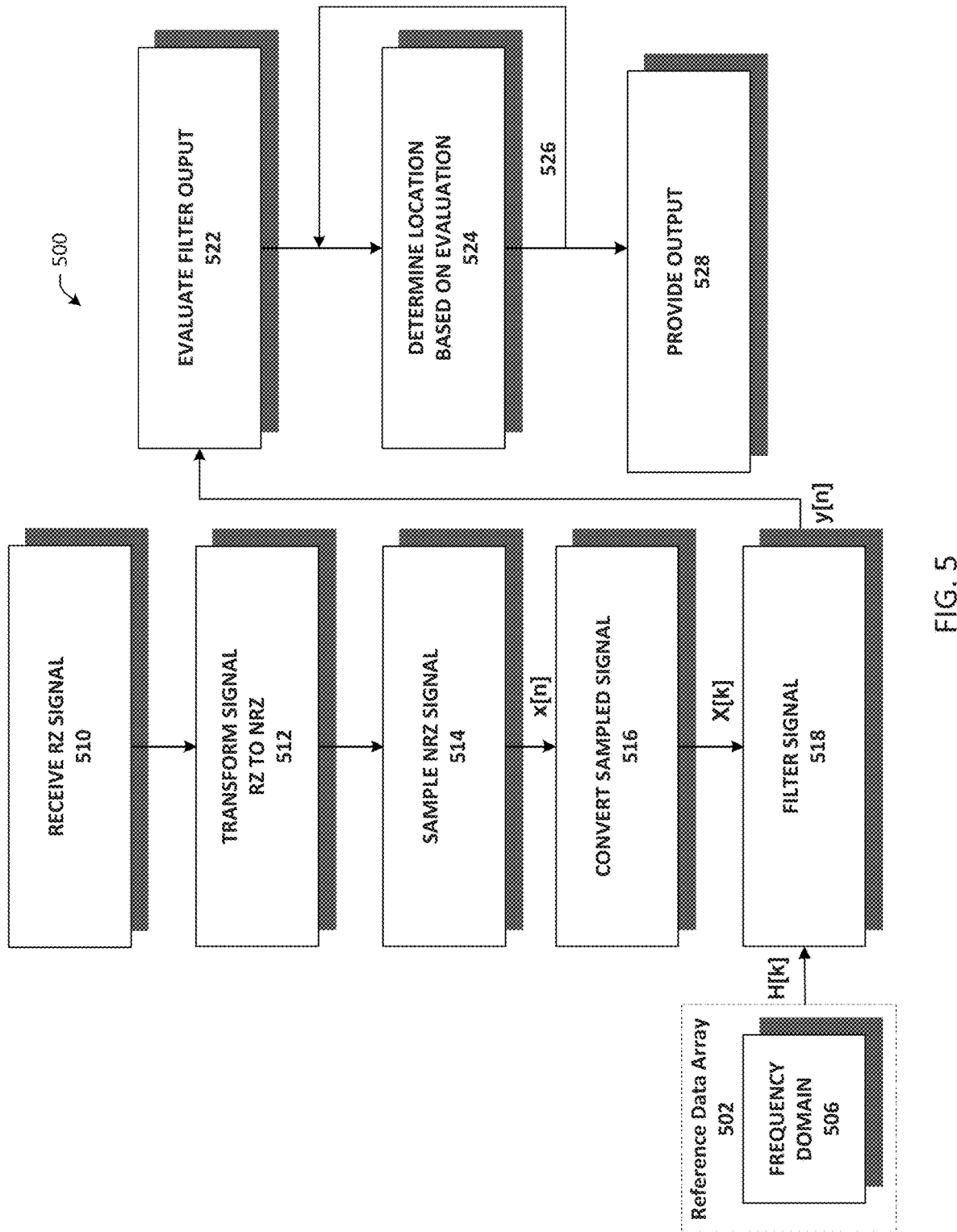
FIG. 5 is an example flow chart of operations for autonomous mower navigation with an aspect of the disclosure.

FIG. 5 is an example flow chart of operations for autonomous mower navigation which can begin at act 502 where a reference data array is generated and stored in a memory associated with the processing component 122. The reference data array can be generated at run time, and/or can be derived in advance and stored by the processing component 122 for later use.

In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 506, the reference data array is generated and includes data associated with the model received signal and a digital sampling rate, for example, the digital sampling rate implemented at act 514. The generation of the reference data array begins with discrete time domain representation of the model non-return-to-zero received signal.

In an embodiment, the reference data array includes a discrete time-reversed time domain representation of the model received signal data, or model signal, and can be derived, for example, as $$h[n]=\text{model signal}[-n]$$

Continuing at act 506, the reference data array is converted to a discrete frequency domain transformation of the discrete time domain representation of the model received signal h[n]. In an embodiment, a fast Fourier transform (FFT) algorithm computes the discrete Fourier transform (DFT).

Still continuing at act 506, the frequency domain reference data array H[k], or frequency response, is calculated by time-reversing and zero-padding the time domain model received signal data, referred to in the below equation as model signal, computing the FFT, and computing the complex conjugate of the result, where the number$_{samples}$ is determined based on the digital filtering rate implemented, for example, at the signal sampling act 514.

$$\text{model signal}'[n] = \begin{cases} \text{model signal}[-n]; n = 0{:}length_{model\ signal} \\ 0; length_{model\ signal} + 1{:}number_{samples} \end{cases}$$

$$H[k] = FFT\{\text{model signal}'[n]\}$$

At the completion of act 506, the reference data array includes a discrete frequency domain transformation of a discrete time domain representation of a model received signal. The reference data array can be generated at run time, or can be derived in advance and stored in memory.

At act 510, the receiver 110 receives a transmitted signal 112, for example, a return-to-zero encoded periodic signal including an asymmetric or symmetric binary pattern including at least one pseudo-random sequence. Inductive sensors 114, 116, 118, 120 pick up the transmitted signal 112. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal.

At act 512, the received signal is transformed into a non-return-to-zero representation of the transmitted return-to-zero encoded signal 112. Due in part to the nature of the inductive pickup response of the sensors 114, 116, 118, 120, the transmitted return-to-zero signal 112 can be transformed into a non-return-to-zero phase-shift keyed representation through appropriate filtering techniques.

At act 514, the non-return-to-zero signal data is digitally sampled, for example, by processing component 122 at a pre-determined sampling rate. At act 516, the digitally sampled non-return-to-zero signal data is converted, or transformed, to a frequency domain representation, utilizing for example, a fast Fourier transform (FFT) algorithm producing X[k].

At act 518, a filtering step is implemented, for example, a frequency domain matched filter yields correlation data as the filter output y[n] The correlation data y[n] can be calculated utilizing a frequency domain based approach by computing a cross-correlation of the frequency domain signal data output of act 516 x[n] and the output of the reference data array H[k] yielding correlation data including maxima and minima occurring within an acquisition period.

The frequency domain approach of act 518 computes the FFT of the output of act 516 x[n]. The resultant data array X[k] is multiplied by the output of the reference data array H[k], yielding Y[k]. When X[k] and H[k] have different lengths, two equal length sequences can be created by adding zero value samples at the end of the shorter of the two sequences. This is commonly referred to as zero-filling or zero padding. The FFT lengths in the algorithm, that is the lengths of X[k] and H[k], should be equal.

$$X[k]=\text{FFT}\{x[n]\}$$

$$Y[k]=X[k]H[k]$$

The result Y[k] can be transformed back into the time domain, yielding y[n], an output of the filter step 518:

$$y[n]=\text{IFFT}\{Y[k]\}$$

In an embodiment, the filter step 518 comprises computing a cross-correlation by multiplying the frequency domain representation of the transformed and sampled received signal by the reference data array to obtain a product, and performing an inverse fast Fourier transform on the product to produce a filter output including at least one correlation maxima and/or at least one correlation minima.

At act 522, the processing component 122 of the receiver 110 evaluates the output y[n] of the filter step 518. The evaluations performed at act 522 are utilized at act 524 to determine the location of the autonomous mower 102 relative to the wire 106.

The evaluations performed at act 522 can include an evaluation of correlation data computed at act 518. For example, the polarity of the received signal, and thus the location of the autonomous mower 102 relative to the area defined by the wire 106, can be determined by considering the distribution, frequency, ratios, and/or total count, of the correlation data computed at act 518. An evaluation of the correlation data computed at act 518 can be determined by considering the correlation data as described in detail in connection with FIG. 2 above.

At act 524 the processing component 122 of the receiver 110 determines the location of the autonomous mower 102 relative to the wire 106 based on the evaluations completed at act 522 of the filtering activities conducted at act 518. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 526, previously identified location information, if any, can be used as feedback, and is provided as input to act 524. The previously identified location information, the output of act 524, is used to improve the accuracy of the location determination step 524 and, in embodiments, functions as a recursive filter.

At act 528, an output based on the location determined at act 524 is provided. The output is used by the system 100 for directing movement and operation of the autonomous mower 102.

Figure 6:
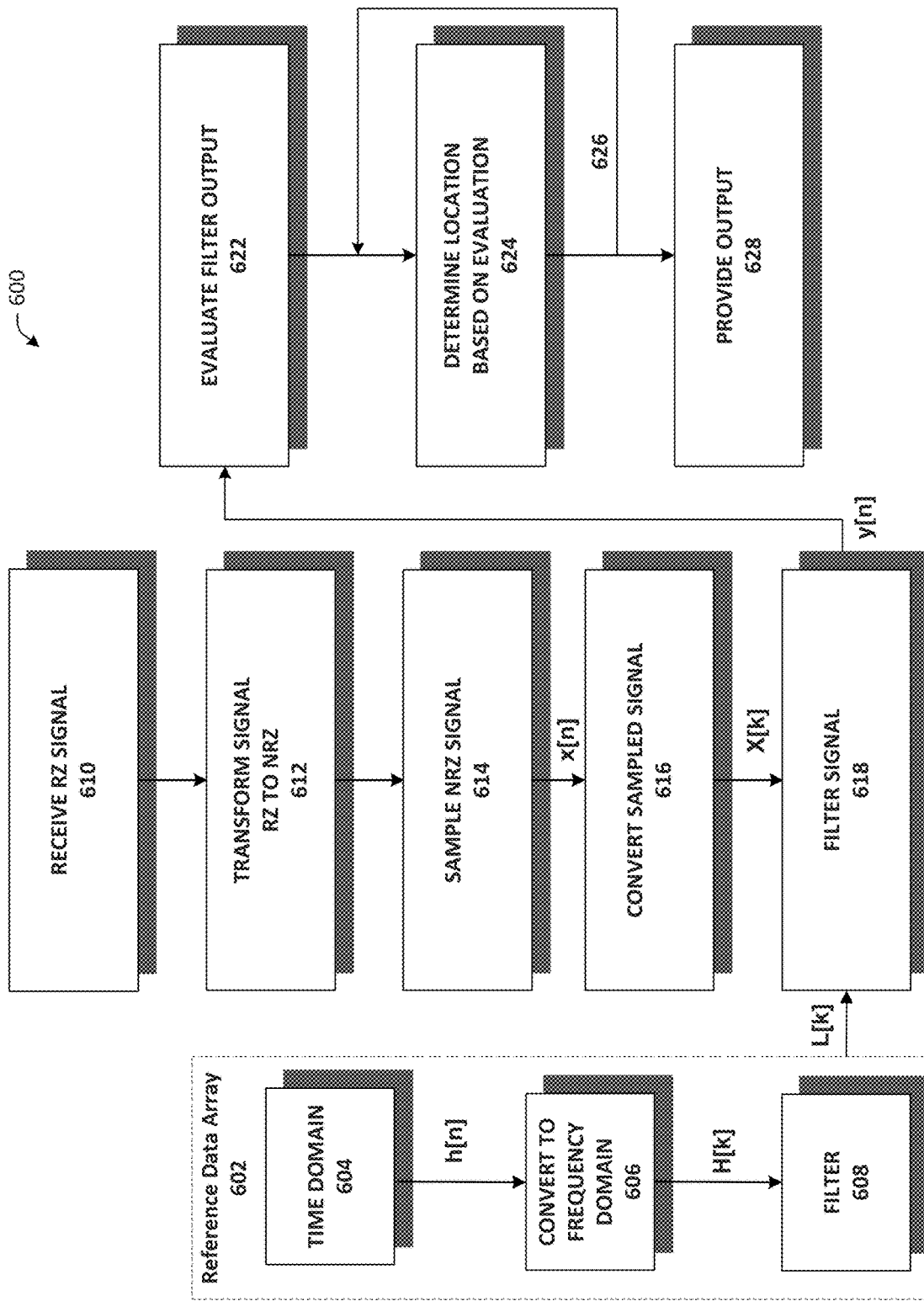
FIG. 6 is an example flow chart of operations for autonomous mower navigation in accordance with an aspect of the disclosure.

FIG. 6 illustrates a method 600 for autonomous mower navigation in accordance with aspects of the disclosure. FIG. 6 is an example flow chart of operations for autonomous mower navigation which can begin at act 602 where a reference data array is generated and stored in a memory associated with the processing component 122. The reference data array can be generated at run time, and/or can be derived in advance and stored by the processing component 122 for later use.

In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 604, the reference data array is modified to include data associated with the model received signal and a digital sampling rate, for example, the digital sampling rate implemented at act 614. The reference data array at act 604 includes a discrete time domain representation of the model non-return-to-zero received signal.

In an embodiment, the reference data array output h[n] is the discrete time-reversed time domain representation of the model received signal data, or model signal, and can be derived, for example, as $$h[n]=\text{model signal}[-n]$$

At act 606, the reference data array is converted to a discrete frequency domain transformation of the discrete time domain representation of the model received signal generated at act 604. In an embodiment, a fast Fourier transform (FFT) algorithm computes the discrete Fourier transform (DFT).

The frequency domain reference data array H[k], or frequency response, can be calculated by time-reversing and zero-padding the time domain model received signal data, referred to in the below equation as model signal, computing the FFT, and computing the complex conjugate of the result, where the number$_{samples}$ is determined based on the digital filtering rate implemented, for example, at the signal sampling act 614.

$$\text{model signal}'[n] = \begin{cases} \text{model signal}[-n]; n = 0:length_{model\ signal} \\ 0; length_{model\ signal} + 1:number_{samples} \end{cases}$$

$$H[k] = FFT\{\text{model signal}'[n]\}$$

At act 608, digital filtering can be implemented utilizing the frequency domain reference data array H[k] to produce L[k]. In an embodiment, L[k] includes a discrete filtered frequency domain transformation of the discrete time domain representation of the model received signal. For example, $L[k]=H[k]Z[k]$, where $Z[k]$ is the frequency response of the filter.

At act 610, the receiver 110 receives a transmitted signal 112, for example, a return-to-zero encoded periodic signal including an asymmetric or symmetric binary pattern including at least one pseudo-random sequence. Inductive sensors 114, 116, 118, 120 pick up the transmitted signal 112. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal.

At act 612, the received signal is transformed into a non-return-to-zero representation of the transmitted return-to-zero encoded signal 112. Due in part to the nature of the inductive pickup response of the sensors 114, 116, 118, 120, the transmitted return-to-zero signal 112 can be transformed into a non-return-to-zero phase-shift keyed representation through appropriate filtering techniques.

At act 614, the non-return-to-zero signal data is digitally sampled, for example, by processing component 122 at a pre-determined sampling rate. At act 616, the digitally sampled non-return-to-zero signal data is converted, or transformed, to a frequency domain representation, utilizing for example, a fast Fourier transform (FFT) algorithm producing X[k].

At act 618, a filtering step is implemented, for example, a frequency domain matched filter yields correlation data as the filter output y[n]. The correlation data y[n] can be calculated utilizing a frequency domain based approach by computing a cross-correlation of the frequency domain signal data output of act 616 x[n] and the output of the reference data array L[k] yielding correlation data including maxima and minima occurring within an acquisition period.

The frequency domain approach of act 618 computes the FFT of the output of act 616 x[n]. The resultant data array X[k] is multiplied by the output of the reference data array L[k], yielding Y[k]. When X[k] and L[k] have different lengths, two equal length sequences can be created by adding zero value samples at the end of the shorter of the two sequences. This is commonly referred to as zero-filling or zero padding. The FFT lengths in the algorithm, that is the lengths of X[k] and L[k], should be equal.

$X[k]=FFT\{x[n]\}$ $Y[k]=X[k]L[k]$

The result Y[k] can be transformed back into the time domain, yielding y[n], an output of the filter step 618:

$y[n]=IFFT\{Y[k]\}$

In an embodiment, the filter step 618 comprises computing a cross-correlation by multiplying the frequency domain representation of the transformed and sampled received signal by the reference data array to obtain a product, and performing an inverse fast Fourier transform on the product to produce a filter output including at least one correlation maxima and/or at least one correlation minima.

At act 622, the processing component 122 of the receiver 110 evaluates the output y[n] of the filter step 618. The evaluations performed at act 622 are utilized at act 624 to determine the location of the autonomous mower 102 relative to the wire 106.

The evaluations performed at act 622 can include an evaluation of correlation data computed at act 618. For example, the polarity of the received signal, and thus the location of the autonomous mower 102 relative to the area defined by the wire 106, can be determined by considering the distribution, frequency, ratios, total count, of correlation data computed at act 618. In an embodiment, the polarity of the received signal can be determined utilizing a counting approach.

Referring to FIG. 13, in the example correlation data there are a total of 9 maxima and 4 minima obtained in the acquisition period. A threshold of 9 maxima (or minima) per acquisition period may be set to make a determination. In this example, when there are 9 maxima, the determination is inside. When there are 9 minima, the determination is outside. If there are neither 9 maxima, nor 9 minima, then no determination may be made.

Still referring to FIG. 13, the polarity of the received signal can be determined utilizing a frequency approach. The frequency of maxima and/or minima occurring within an acquisition period can be established to make a determination of inside or outside. The frequency of maxima is 9 per 100, and the frequency of minima is 4 per 100. In this example, a determination of inside/outside can be based solely, or in part, on the frequency of maxima and/or minima.

The maxima and/or minima occurring within an acquisition period for signals including more than one pseudo-random sequence can also be considered. Referring to FIG. 14, the transmitted signal 112 includes two pseudo-random sequences. The received signal can be processed to detect maxima and/or minima for each pseudo-random sequence, respectively. In an embodiment, a threshold of one maxima for each pseudo-random sequence can be established in order to make a determination. For example, one maxima for each pseudo-random sequence indicates inside. One minima for each pseudo-random sequence indicates outside. In this example, for other combinations, no determination is made.

The polarity of the received signal can be determined utilizing a ratio approach. In embodiments, the ratio of maxima to minima occurring within an acquisition period can be used to determine inside or outside. In this example, a ratio of 9(max):4(min) indicates that a determination of inside should be made, a ratio of 4(max):9(min) indicates a determination of outside.

As described above in connection with act 622, at act 624 the processing component 122 of the receiver 110 determines the location of the autonomous mower 102 relative to the wire 106 based on the evaluations completed at act 622 of the filtering activities conducted at act 618. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 626, previously identified location information, if any, can be used as feedback, and is provided as input to act 624. The previously identified location information, the output of act 624, is used to improve the accuracy of the location determination step 624 and, in embodiments, functions as a recursive filter.

At act 628, an output based on the location determined at act 624 is provided. The output is used by the system 100 for directing movement and operation of the autonomous mower 102.

Figure 7:
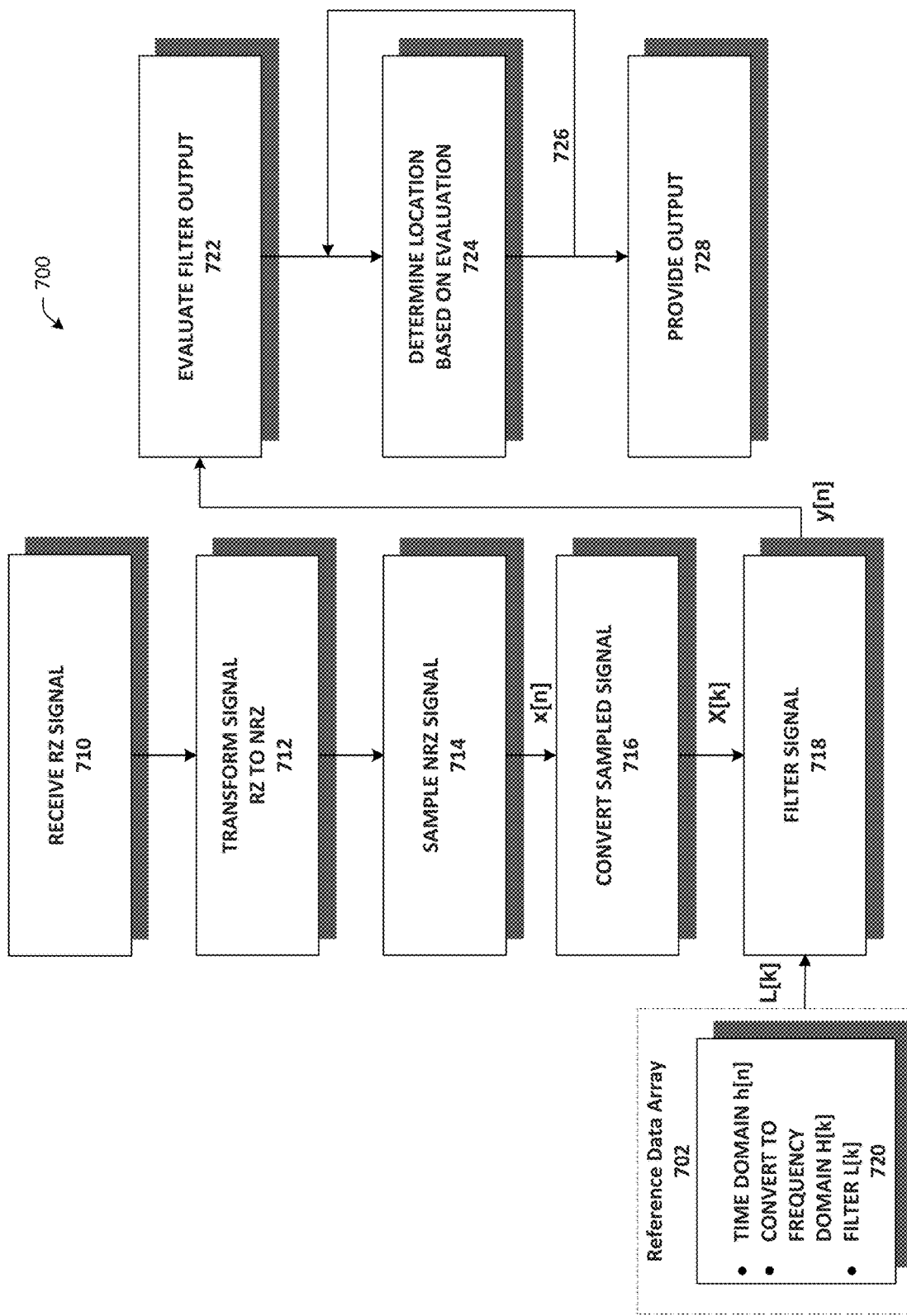
FIG. 7 is an example flow chart of operations for autonomous mower navigation in accordance with an aspect of the disclosure.

FIG. 7 illustrates a method 700 for autonomous mower navigation in accordance with aspects of the disclosure. FIG. 7 is an example flow chart of operations for autonomous mower navigation which can begin at act 702 where a reference data array is generated and stored in a memory associated with the processing component 122. The reference data array can be generated at run time, and/or can be derived in advance and stored by the processing component 122 for later use.

In an embodiment, the reference data array is based on a model received signal derived with knowledge of the transmitted signal 112. The model signal can include a representation of an ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

At act 720, the reference data array is generated and includes data associated with the model received signal and a digital sampling rate, for example, the digital sampling rate implemented at act 714. The generation of the reference data array begins with discrete time domain representation of the model non-return-to-zero received signal.

In an embodiment, the reference data array includes a discrete time-reversed time domain representation of the model received signal data, or model signal, and can be derived, for example, as $$h[n]=model\ signal[-n]$$

Continuing at act 720, the reference data array is converted to a discrete frequency domain transformation of the discrete time domain representation of the model received signal h[n]. In an embodiment, a fast Fourier transform (FFT) algorithm computes the discrete Fourier transform (DFT).

Still continuing at act 720, the frequency domain reference data array H[k], or frequency response, is calculated by time-reversing and zero-padding the time domain model received signal data, referred to in the below equation as model signal, computing the FFT, and computing the complex conjugate of the result, where the number$_{samples}$ is determined based on the digital filtering rate implemented, for example, at the signal sampling act 714.

$$model\ signal'[n] = \begin{cases} model\ signal[-n]; n = 0:length_{model\ signal} \\ 0; length_{model\ signal} + 1:number_{samples} \end{cases}$$

$$H[k] = FFT\{model\ signal'[n]\}$$

Still continuing at act 720, digital filtering is implemented utilizing, for example, the frequency domain reference data array H[k] to produce L[k]. In an embodiment, L[k] includes a discrete filtered frequency domain transformation of the discrete time domain representation of the model received signal. For example, $$L[k]=H[k]Z[k], \text{ where } Z[k] \text{ is the frequency response of the filter.}$$

At the completion of act 720, the reference data array includes a discrete filtered frequency domain transformation of a discrete time domain representation of a model received signal. The reference data array can be generated at run time, or can be derived in advance and stored in memory.

At act 710, the receiver 110 receives a transmitted signal 112, for example, a return-to-zero encoded periodic signal including an asymmetric or symmetric binary pattern including at least one pseudo-random sequence. Inductive sensors 114, 116, 118, 120 pick up the transmitted signal 112. To detect the transmitted signal 112 efficiently, a filter associated with the receiver 110 is tuned to produce an output signal that matches an ideal received signal as closely as possible. The filter can include an adjustable gain amplifier that provides additional signal conditioning. The current through the sensors 114, 116, 118, 120 exhibits a pulse for each transition in the transmitted signal.

At act 712, the received signal is transformed into a non-return-to-zero representation of the transmitted return-to-zero encoded signal 112. Due in part to the nature of the inductive pickup response of the sensors 114, 116, 118, 120, the transmitted return-to-zero signal 112 can be transformed into a non-return-to-zero phase-shift keyed representation through appropriate filtering techniques.

At act 714, the non-return-to-zero signal data is digitally sampled, for example, by processing component 122 at a pre-determined sampling rate. At act 716, the digitally sampled non-return-to-zero signal data is converted, or transformed, to a frequency domain representation, utilizing for example, a fast Fourier transform (FFT) algorithm producing X[k].

At act 718, a filtering step is implemented, for example, a frequency domain matched filter yields correlation data as the filter output y[n]. The correlation data y[n] can be calculated utilizing a frequency domain based approach by computing a cross-correlation of the frequency domain signal data output of act 716 x[n] and the output of the reference data array L[k] yielding correlation data including maxima and minima occurring within an acquisition period.

The frequency domain approach of act 718 computes the FFT of the output of act 716 x[n]. The resultant data array X[k] is multiplied by the output of the reference data array L[k], yielding Y[k]. When X[k] and L[k] have different lengths, two equal length sequences can be created by adding zero value samples at the end of the shorter of the two sequences. This is commonly referred to as zero-filling or zero padding. The FFT lengths in the algorithm, that is the lengths of X[k] and L[k], should be equal.

$X[k]=\text{FFT}\{x[n]\}$ $Y[k]=X[k]L[k]$

The result Y[k] can be transformed back into the time domain, yielding y[n], an output of the filter step 718:

$y[n]=\text{IFFT}\{Y[k]\}$

In an embodiment, the filter step 718 comprises computing a cross-correlation by multiplying the frequency domain representation of the transformed and sampled received signal by the reference data array to obtain a product, and performing an inverse fast Fourier transform on the product to produce a filter output including at least one correlation maxima and/or at least one correlation minima.

At act 722, the processing component 122 of the receiver 110 evaluates the output y[n] of the filter step 718. The evaluations performed at act 722 are utilized at act 724 to determine the location of the autonomous mower 102 relative to the wire 106.

The evaluations performed at act 722 can include an evaluation of correlation data computed at act 718. For example, the polarity of the received signal, and thus the location of the autonomous mower 102 relative to the area defined by the wire 106, can be determined by considering the distribution, frequency, ratios, total count, of correlation data computed at act 718. An evaluation of correlation data computed at act 718 can be determined by considering the correlation data as described in detail in connection with FIGS. 2-6 above.

At act 724 the processing component 122 of the receiver 110 determines the location of the autonomous mower 102 relative to the wire 106 based on the evaluations completed at act 722 of the filtering activities conducted at act 718. When the sensors 114, 116, 118, 120 are located within a work area 108 defined by the wire 106, the received signal is in phase with the expected sequence. If sensor 120 is located outside of the defined work area 108, e.g. located in a non-work area 132, the received signal will be out of phase with the expected sequence and 180 degrees out of phase with the transmitted signal 112.

At act 726, previously identified location information, if any, can be used as feedback, and is provided as input to act 724. The previously identified location information, the output of act 724, is used to improve the accuracy of the location determination step 724 and, in embodiments, functions as a recursive filter.

At act 728, an output based on the location determined at act 724 is provided. The output is used by the system 100 for directing movement and operation of the autonomous mower 102.

Figure 8:
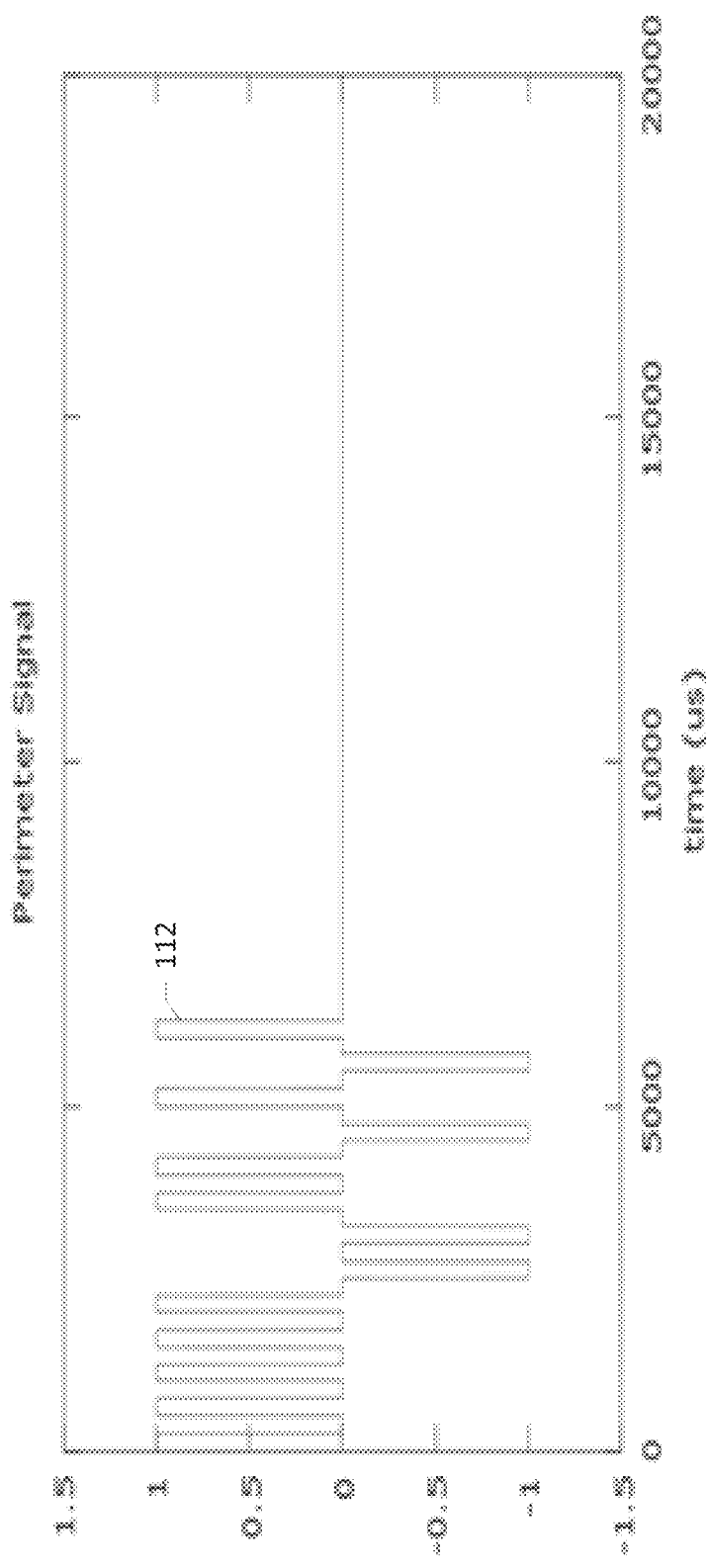
FIG. 8 is an illustration of an example signal for autonomous mower navigation in accordance with an aspect of the disclosure.

FIG. 8 is an illustration of an example transmitted signal 112 format.

Figure 9:
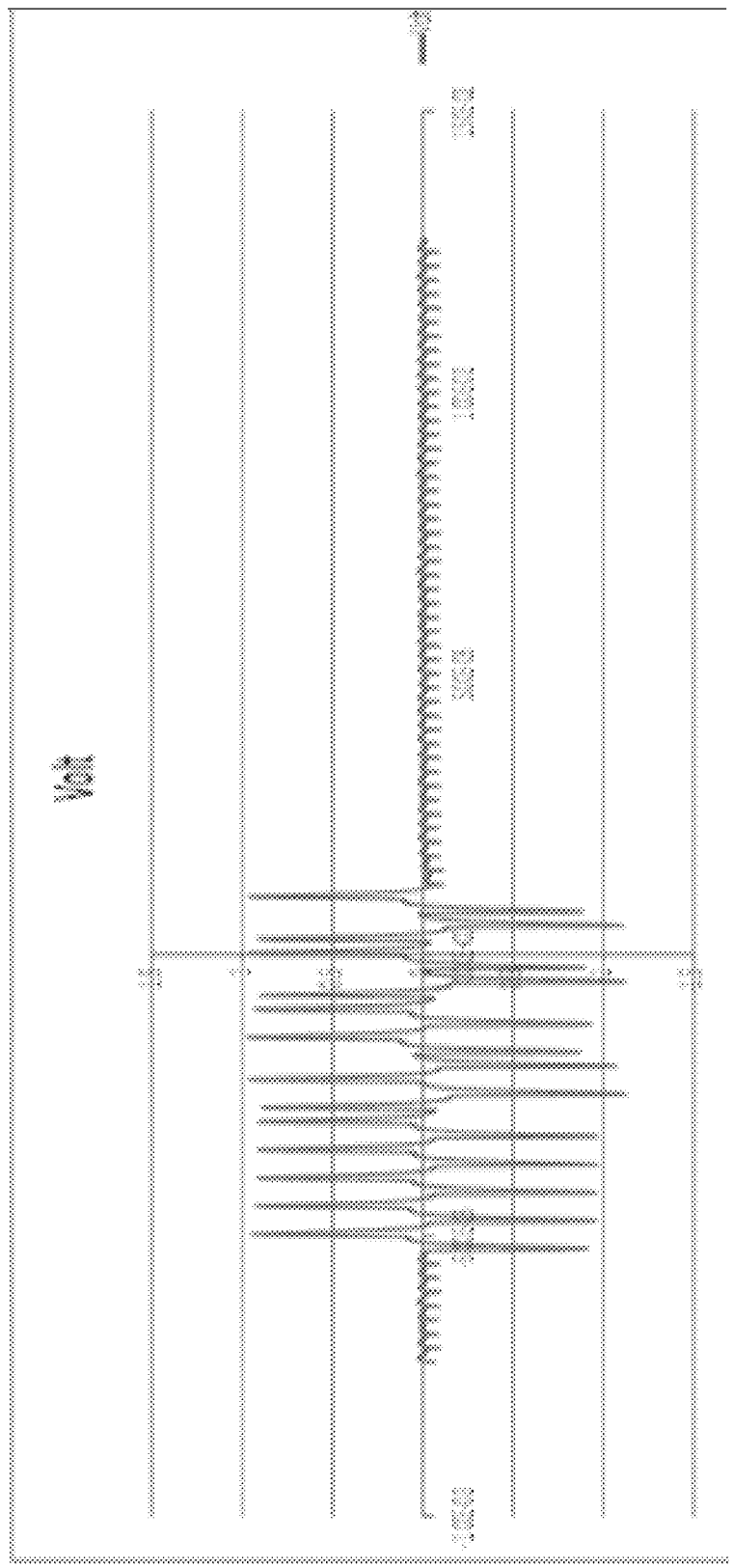
FIG. 9 is an illustration of an example signal for autonomous mower navigation in accordance with an aspect of the disclosure.

FIG. 9 is an illustration of an example inductive coil current response, e.g. sensors 114, 116, 118, 120, to the transmitted signal 112. The current through the inductive coil exhibits a pulse for each transition in the transmitted signal 112. The signal can then be filtered to elicit the desired response.

Figure 10:
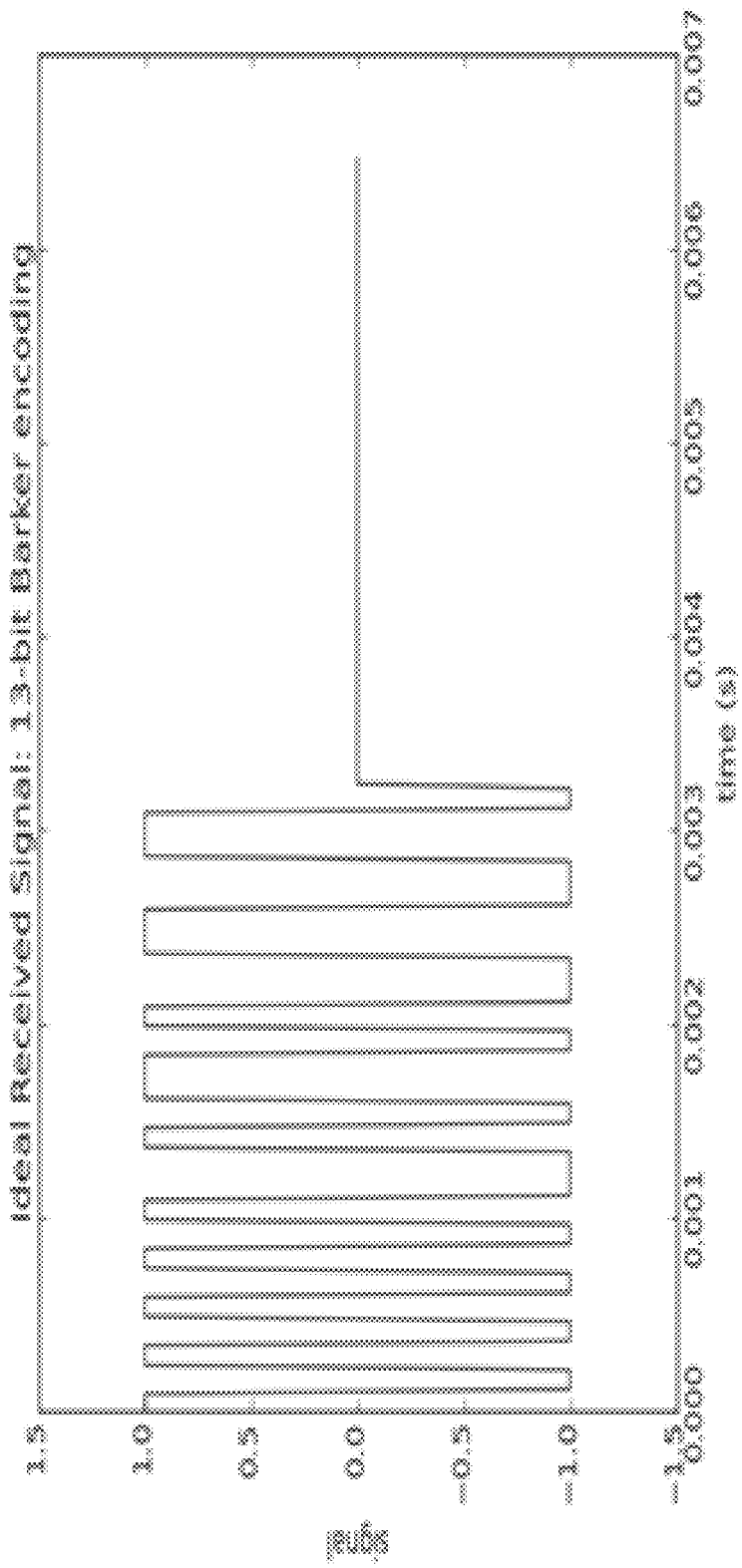
FIG. 10 is an illustration of an example signal for autonomous mower navigation in accordance with an aspect of the disclosure.

FIG. 10 is an illustration of an example ideal received signal. The ideal received signal can include, for example, a representation of the transmitted signal 112 absent noise, distortion, interference, and/or loss that could be associated with the transmitted signal 112 as seen at a receiver. Data related to the ideal received signal can be obtained from a simulation, or can be detected and recorded, and stored in memory. In embodiments, data related to the ideal received signal can be generated utilizing an algorithm.

Figure 11:
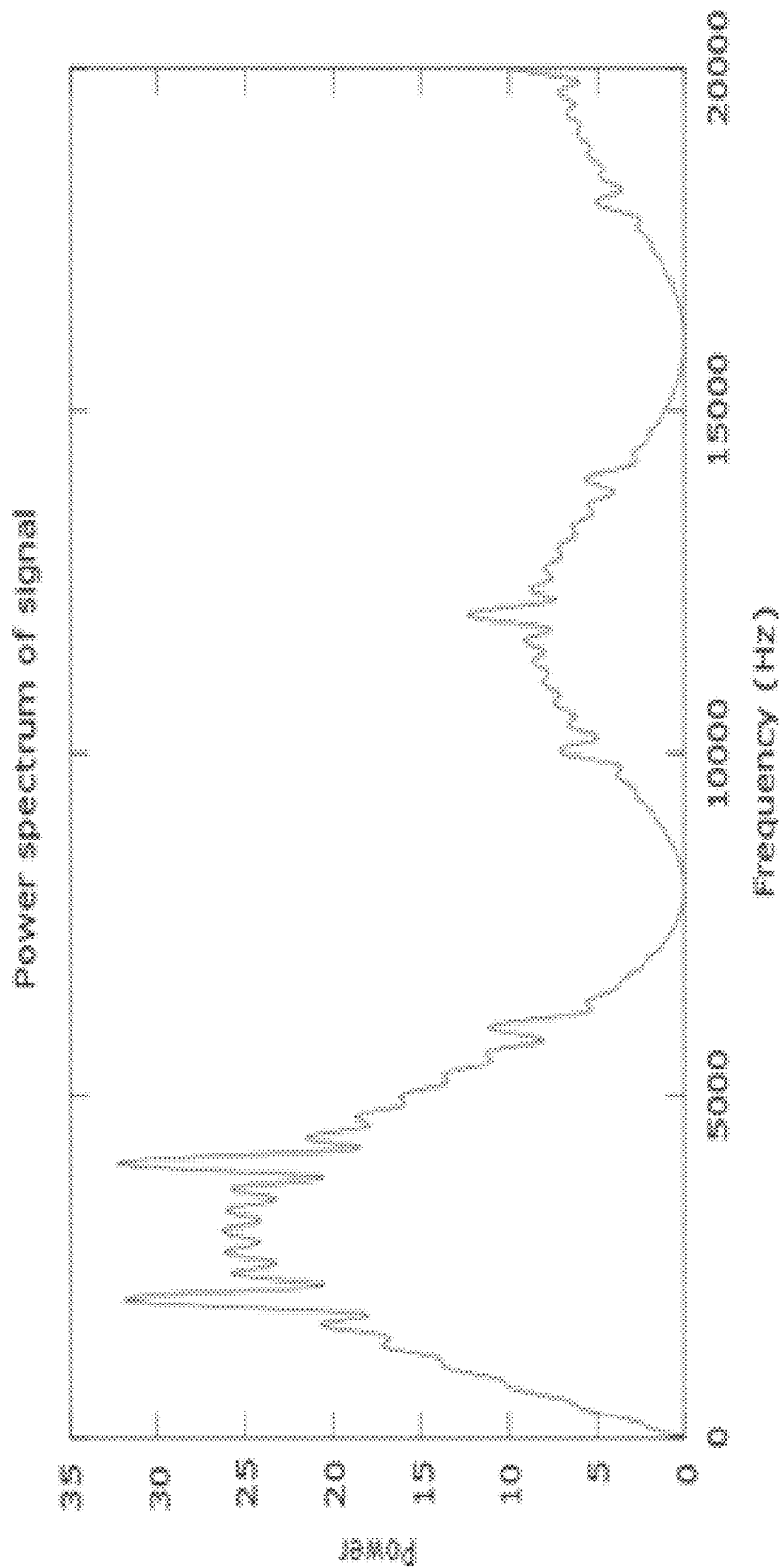
FIG. 11 is an illustration of an example signal for autonomous mower navigation in accordance with an aspect of the disclosure.

FIG. 11 is an illustration of an example power spectrum of the transmitted signal 112.

FIG. 12 is an example timing sequence for the transmitted signal 112, or perimeter signal, and guide wire signal. During autonomous operation, a return-to-zero encoded periodic signal 112 having an asymmetric or symmetric binary pattern and including a pseudo-random sequence is transmitted via the wire 106. One or more guide wires 140, which can be co-terminated at the perimeter wire return, or at a docking or charging station, can be driven in a similar manner, their respective return-to-zero encoded signals including different pseudo-random sequences.

The pseudo-random sequences employed in driving the perimeter wire and guide wires can be selected from a set of codes having good auto-correlation properties and low cross-correlation with the other sequences in the set. The full transmission period can be divided into several variable length time slots 1202, and each slot assigned to one signal. Signal patterns can be sequenced over a transmission period such that one signal is active at a given time.

FIG. 13 is an illustration of example correlation data obtained within an acquisition period and calculated for a received signal pattern and a reference data array. The example correlation shown in FIG. 13 is representative of output obtained, for example, as y[n] from the filtering act 218, 318, 418, 518, 618, and/or 718, as described in detail supra.

FIG. 14 is an illustration of example correlation data calculated for a received signal pattern including two pseudo-random sequences. The transmitted signal includes a return-to-zero encoded signal having two distinct pseudo-random sequences. The received signal 1402 is cross-correlated with a reference data array to produce correlation data including maxima and/or minima values for each of the sequences, respectively. The correlation data is illustrated in FIG. 14 as filter 1 output 1404, and filter 2 output 1406. The correlation date may be calculated, for example, at acts 218, 318, 418, 518, 618, and/or 718. In an embodiment, a threshold of one maxima for each sequence can be established in order to make a determination. For example, one maxima for each sequence indicates inside the perimeter wire 106. One minima for each sequence indicates outside the perimeter wire 106. For other combinations, no determination is made.

Figure 15:
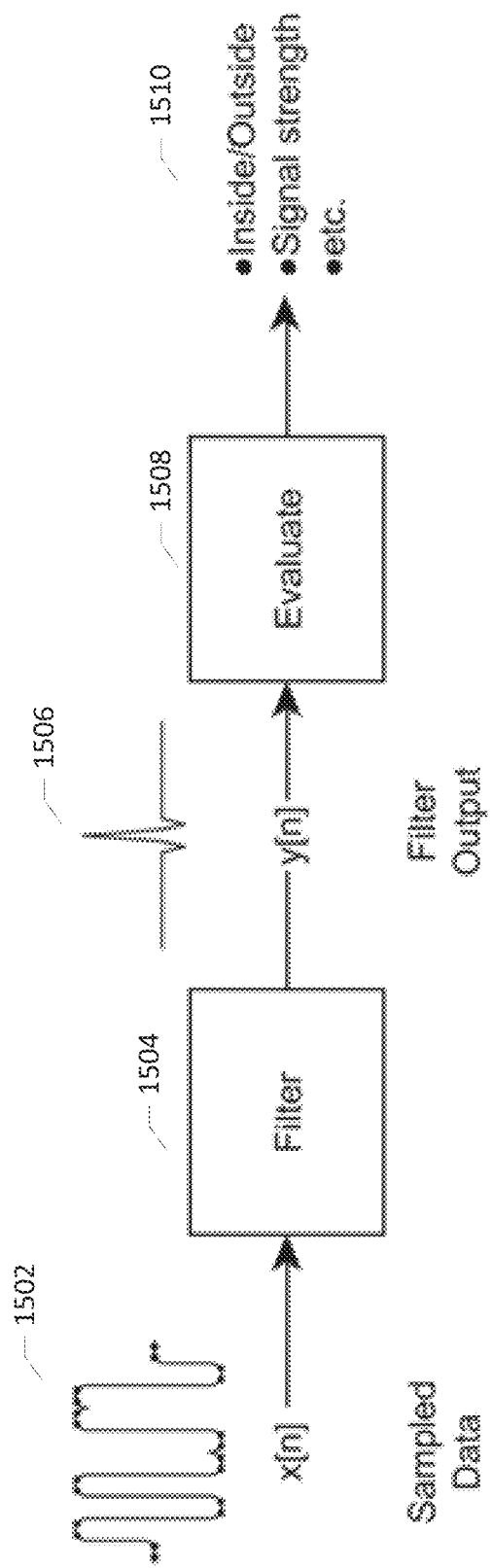
FIG. 15 an example flow of operations for autonomous mower navigation in accordance with an aspect of the disclosure.

FIG. 15 is an illustration of an example digital signal processing flow for the analog signals received at sensors 114, 116, 118, 120. The analog signals can be digitally sampled 1502 by an analog to digital converter associated with the processing component 122. For each set of coil data x[n], the data can be filtered 1504 to produce an array of correlation output data y[n] 1506. The data is then evaluated 1508 in order to determine if the coil is located inside or outside the perimeter, the amplitude of the received signal, signal strength, and other information 1510.

Figure 16:
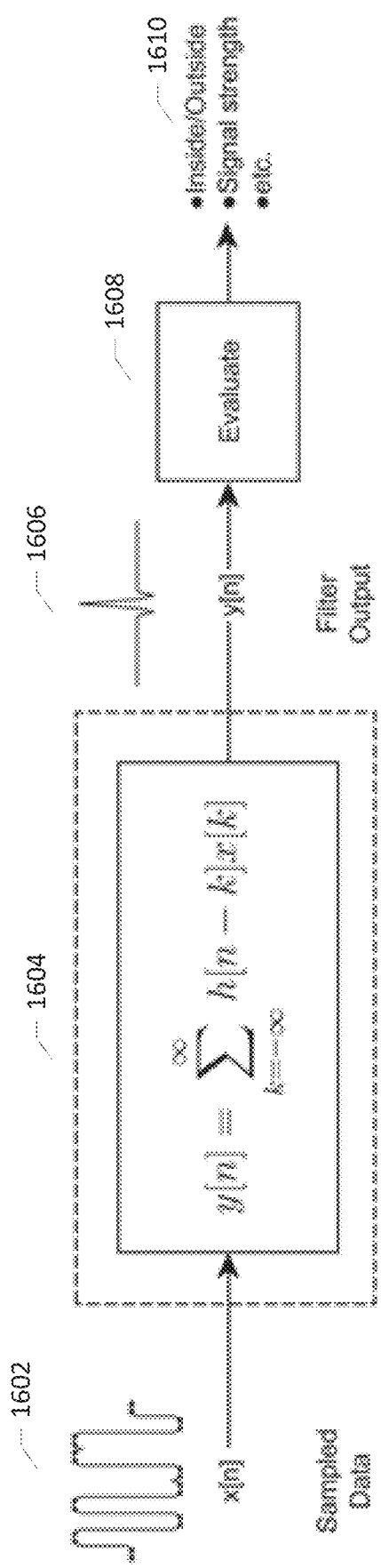
FIG. 16 an example flow of operations for autonomous mower navigation in accordance with an aspect of the disclosure.

FIG. 16 is an illustration of an example signal processing flow utilizing, for example, a time domain matched filter. A mathematical description of some aspects of FIG. 16 is now given to help further the understanding of the signal processing techniques. The correlation y[n] 1604 can be calculated by computing the convolution of the digitally sampled signal data x[n] 1602 and the impulse response h[n], where h[n] is the time-reversed time domain representation of the model received signal data, referred to here as the model signal.

$$h[n] = \text{model signal}[-n]$$

$$y[n] = \sum_{k=-\infty}^{\infty} h[n-k]x[k]$$

The data can be filtered to produce an array of correlation output data y[n] 1606. The data is then evaluated 1608 in order to determine if the coil is located inside or outside the perimeter, the amplitude of the received signal, signal strength, and other information 1610.

Figure 17:
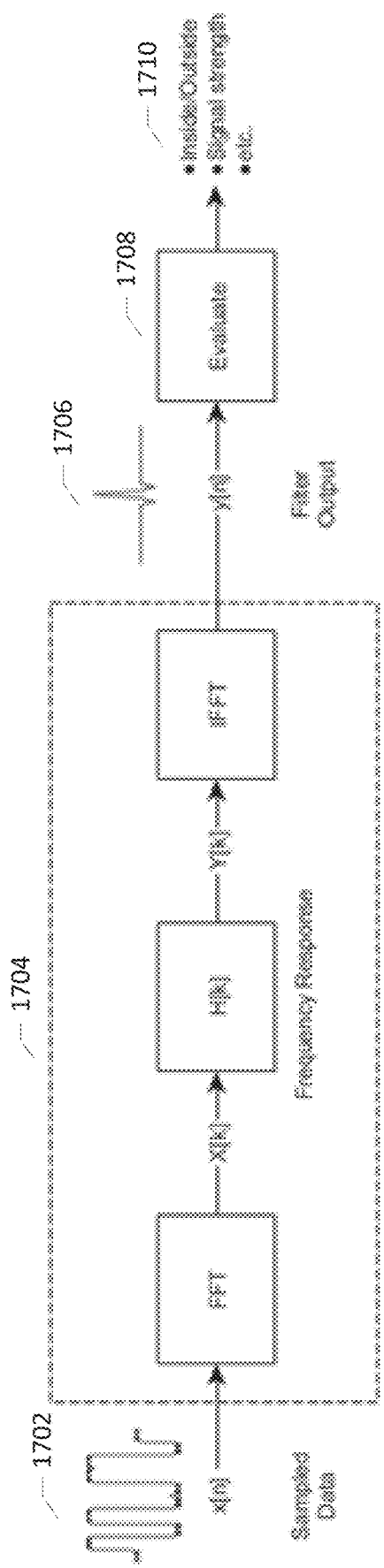
FIG. 17 an example flow of operations for autonomous mower navigation in accordance with an aspect of the disclosure.

FIG. 17 is an illustration of an example signal processing flow utilizing a frequency domain based approach. An efficient method for calculating correlation is to utilize transformation into the frequency domain. A mathematical description of some aspects of FIG. 17 is now given to help further the understanding of the signal processing techniques.

The frequency domain reference data array H[k], or frequency response, can be calculated by time-reversing and zero-padding the time domain model received signal data, referred to here as the model signal, computing the FFT, and computing the complex conjugate of the result, where the number$_{samples}$ is determined based on the digital filtering rate implemented, for example, at the respective signal sampling acts at 214, 314, 414, 514, 614 or 714.

$$\text{model signal}'[n] = \begin{cases} \text{model signal}[-n]; n = 0:length_{model\ signal} \\ 0; length_{model\ signal} + 1:number_{samples} \end{cases}$$

$$H[k] = FFT\{\text{model signal}'[n]\}$$

The reference data array H[k] may be stored in memory and so that it is not necessary to compute H[k] each time the correlation is computed. Additional digital filtering can be directly incorporated into H[k] to produce a reference data array L[k]. The reference data array L[k] may be stored in memory and so that it is not necessary to compute L[k] each time the correlation is computed.

In an embodiment, L[k] includes a discrete filtered frequency domain transformation of the discrete time domain representation of the model received signal. For example, $L[k]=H[k]Z[k]$, where Z[k] is the frequency response of the filter.

A frequency domain approach 1704 computes the FFT of the digitally sampled signal data x[n] 1702. The resultant data array X[k] is multiplied by the output of the reference data array L[k], yielding M. Correlation in the frequency domain[k] can then be calculated. In embodiments, the discrete filtered frequency domain reference data array L[k] is substituted for H[k] in the following:

$X[k]=FFT\{x[n]\}$ $Y[k]=X[k]H[k]$

The result can be transformed back into the time domain.

$y[n]=IFFT\{Y[k]\}$

The data can be filtered to produce an array of correlation output data y[n] 1706. The data is then evaluated 1708 in order to determine if the coil is located inside or outside the perimeter, the amplitude of the received signal, signal strength, and other information 1710.

While embodiments of the disclosed autonomous mower navigation system and method have been described, it should be understood that the disclosed autonomous mower navigation system and method are not so limited and modifications may be made without departing from the disclosed autonomous mower navigation system and method. The scope of the autonomous mower navigation system and method are defined by the appended claims, and all devices, processes, and methods that come within the meaning of the claims, either literally or by equivalence, are intended to be embraced therein.

The invention claimed is:

1. A computer implemented method for autonomous mower navigation, comprising:
   receiving a return-to-zero encoded signal including a neutral condition between bits and comprising at least one pseudo-random sequence, wherein the neutral condition comprises a value halfway between a condition representing a 1 bit and a condition representing a 0 bit;
   transforming the received signal to a non-return-to-zero phase-shift keyed representation, wherein the non-return-to-zero phase-shift keyed representation comprises a binary code in which binary 0's are represented by a negative voltage and binary 1's are represented by a positive voltage, and wherein the non-return-to-zero phase-shift keyed representation does not include a neutral condition;
   digitally sampling the non-return-to-zero signal representation in a time domain;
   filtering the sampled signal utilizing a reference data array based on the return-to-zero encoded signal to produce a filter output; and
   determining a location of the autonomous mower relative to a defined work area based on an evaluation of the filter output.

2. The method for autonomous mower navigation of claim 1, comprising receiving a plurality of return-to-zero encoded signals each signal comprising at least one pseudo-random sequence, wherein the pseudo-random sequences comprise a set of sequences having good auto-correlation properties and a low cross-correlation with other sequences in the set.

3. The method for autonomous mower navigation of claim 2, wherein at least one return-to-zero encoded signal is associated with the defined work area, and at least one return-to-zero encoded signal is associated with a guide wire.

4. The method for autonomous mower navigation of claim 1, wherein the pseudo-random sequence comprises at least one of Barker Codes, Gold Codes, Kasami Codes, Walsh Hadamard Codes, and/or similarly derived codes.

5. The method for autonomous mower navigation of claim 1, wherein filtering the sampled signal comprises utilizing a time domain matched filter based on the non-return-to-zero representation to produce at least one correlation maxima and/or at least one correlation minima.

6. The method for autonomous mower navigation of claim 5, wherein the at least one correlation maxima and/or at least one correlation minima comprises a single correlation maxima and/or a single correlation minima.

7. The method for autonomous mower navigation of claim 1, comprising
   converting the digitally sampled signal from a time domain to a representation in a frequency domain; and
   wherein filtering the sampled signal comprises computing a cross-correlation by multiplying the frequency domain representation by the reference data array to obtain a product, and performing an inverse fast Fourier transform on the product to produce at least one correlation maxima and/or at least one correlation minima.

8. The method for autonomous mower navigation of claim 7, wherein the at least one correlation maxima and/or at least one correlation minima comprises a single correlation maxima and/or a single correlation minima.

9. The method for autonomous mower navigation of claim 1, wherein the evaluation comprises one or more of a count of correlation minima and/or maxima, a ratio of correlation minima and/or maxima, and a frequency of correlation minima and/or maxima, occurring within an acquisition period.

10. The method for autonomous mower navigation of claim 1, wherein the evaluation comprises one or more of a distribution of correlation minima and/or maxima, and a threshold value of correlation minima and/or maxima, occurring within an acquisition period.

11. The method for autonomous mower navigation of claim 1, wherein the reference data array comprises a discrete time domain representation of a model non-return-to-zero received signal.

12. The method for autonomous mower navigation of claim 1, wherein the reference data array comprises a discrete frequency domain transformation of a discrete time domain representation of a model received signal.

13. The method for autonomous mower navigation of claim 1, wherein the reference data array comprises a discrete filtered frequency domain transformation of a discrete time domain representation of a model received signal.

14. A system for autonomous mower navigation, comprising:
at least one inductive sensor for receiving a return-to-zero encoded signal comprising at least one pseudo-random sequence transmitted over a wire defining a work area, wherein the return-to-zero encoded signal includes a neutral condition between bits, the neutral condition comprising a value halfway between a condition representing a 1 bit and a condition representing a 0 bit;
a processing component in communication with the at least one sensor and for receiving the signal data, wherein the processing component is configured to
 i. transform the signal data to a non-return-to-zero phase-shift keyed representation of the signal data, wherein the non-return-to-zero phase-shift keyed representation comprises a binary code in which binary 0's are represented by a negative voltage and binary 1's are represented by a positive voltage, and wherein the non-return-to-zero phase-shift keyed representation does not include a neutral condition;
 ii. digitally sample the non-return-to-zero signal representation in a time domain; and
a filter in communication with the processing component for filtering the sampled signal utilizing a reference data array based on the return-to-zero encoded signal to produce a filter output, wherein the processing component receives the filter output and is configured to determine a location of the autonomous mower relative to the defined work area based on an evaluation of the filter output.

15. The system for autonomous mower navigation of claim 14, comprising a plurality of return-to-zero encoded signals each signal comprising at least one pseudo-random sequence, wherein the pseudo-random sequences comprise a set of sequences having good auto-correlation properties and a low cross-correlation with other sequences in the set.

16. The system for autonomous mower navigation of claim 15, wherein at least one return-to-zero encoded signal is associated with the defined work area, and at least one return-to-zero encoded signal is associated with a guide wire.

17. The system for autonomous mower navigation of claim 14, wherein the pseudo-random sequence comprises at least one of Barker Codes, Gold Codes, Kasami Codes, Walsh Hadamard Codes, and/or similarly derived codes.

18. The system for autonomous mower navigation of claim 14, wherein the filter comprises a time domain matched filter based on the non-return-to-zero representation, and the filter output comprises at least one correlation maxima and/or at least one correlation minima.

19. The system for autonomous mower navigation of claim 18, wherein the at least one correlation maxima and/or at least one correlation minima comprises a single correlation maxima and/or a single correlation minima.

20. The system for autonomous mower navigation of claim 14, wherein the digitally sampled signal is converted from a time domain to a representation in a frequency domain; and
wherein the filter is configured to calculate a cross-correlation by multiplying the frequency domain representation by the reference data array to obtain a product, and performing an inverse fast Fourier transform on the product to produce at least one correlation maxima and/or at least one correlation minima.

21. The system for autonomous mower navigation of claim 20, wherein the at least one correlation maxima and/or at least one correlation minima comprises a single correlation maxima and/or a single correlation minima.

22. The system for autonomous mower navigation of claim 14, wherein the evaluation comprises one or more of a count of correlation minima and/or maxima, a ratio of correlation minima and/or maxima, and a frequency of correlation minima and/or maxima, occurring within an acquisition period.

23. The system for autonomous mower navigation of claim 14, wherein the evaluation comprises one or more of a distribution of correlation minima and/or maxima, and a threshold value of correlation minima and/or maxima, occurring within an acquisition period.

24. The system for autonomous mower navigation of claim 14, wherein the reference data array comprises a discrete time domain representation of a model non-return-to-zero received signal.

25. The system for autonomous mower navigation of claim 14, wherein the reference data array comprises a discrete frequency domain transformation of a discrete time domain representation of a model received signal.

26. The system for autonomous mower navigation of claim 14, wherein the reference data array comprises a discrete filtered frequency domain transformation of a discrete time domain representation of a model received signal.

* * * * *